United States Patent
Kikuchi

(10) Patent No.: US 7,463,519 B1
(45) Date of Patent: Dec. 9, 2008

(54) MIS-TRANSISTOR-BASED NONVOLATILE MEMORY DEVICE FOR AUTHENTICATION

(75) Inventor: Takashi Kikuchi, Fukuoka (JP)

(73) Assignee: NSCORE Inc., Fukuoka-Shi (JP)

( * ) Notice: Subject to any disclaimer, the term of this patent is extended or adjusted under 35 U.S.C. 154(b) by 0 days.

(21) Appl. No.: 11/843,020

(22) Filed: Aug. 22, 2007

(51) Int. Cl.
*G11C 16/04* (2006.01)

(52) U.S. Cl. .......................... 365/185.05; 365/185.23; 365/189.08

(58) Field of Classification Search .......... 365/185.05, 365/185.23, 189.05, 189.07, 189.08, 230.06, 365/230.08
See application file for complete search history.

(56) References Cited

U.S. PATENT DOCUMENTS

| | | | |
|---|---|---|---|
| 3,636,530 A | 1/1972 | Mark et al. | |
| 4,419,744 A | 12/1983 | Rutter | |
| 4,791,607 A * | 12/1988 | Igarashi et al. | 365/51 |
| 5,956,269 A | 9/1999 | Ouyang et al. | |
| 6,038,168 A | 3/2000 | Allen et al. | |
| 6,064,590 A | 5/2000 | Han et al. | |
| 6,614,684 B1 * | 9/2003 | Shukuri et al. | 365/185.05 |
| 6,644,548 B1 * | 11/2003 | Lin et al. | 235/451 |
| 6,740,927 B1 | 5/2004 | Jeng | |
| 6,906,953 B2 | 6/2005 | Forbes | |
| 6,906,962 B2 | 6/2005 | Layman et al. | |
| 6,909,635 B2 | 6/2005 | Forbes et al. | |
| 7,227,234 B2 | 6/2007 | Roizin et al. | |
| 2004/0232477 A1 | 11/2004 | Iwata et al. | |
| 2004/0252554 A1 | 12/2004 | Fournel et al. | |

FOREIGN PATENT DOCUMENTS

| | | |
|---|---|---|
| JP | 6-76582 | 3/1994 |
| JP | 6-231587 | 8/1994 |
| JP | 2001-156188 | 6/2001 |
| JP | 2002-237540 | 8/2002 |
| WO | WO2004/057621 | 7/2004 |
| WO | 2006093629 | 9/2006 |

* cited by examiner

*Primary Examiner*—Gene N. Auduong
(74) *Attorney, Agent, or Firm*—Ladas & Parry LLP

(57) ABSTRACT

A nonvolatile semiconductor memory device includes a data input buffer configured to receive data from outside the device, a nonvolatile memory cell including two MIS transistors to store first data received by the data input buffer by creating an irreversible change of transistor characteristics in one of the two MIS transistors, whichever is selected in response to a value of the first data, a sense latch coupled to the nonvolatile memory cell and configured to store the first data obtained by sensing a difference in the transistor characteristics between the two MIS transistors of the nonvolatile memory cell, and a logic circuit configured to produce a signal indicative of comparison between the first data stored in the sense latch and second data received by the data input buffer, wherein no data path to output the first data stored in the sense latch to outside the nonvolatile semiconductor memory device exists.

8 Claims, 19 Drawing Sheets

MIS-TRANSISTOR-BASED NONVOLATILE MEMORY DEVICE FOR AUTHENTICATION

BACKGROUND OF THE INVENTION

1. Field of the Invention

The present invention generally relates to a memory circuit, and particularly relates to a nonvolatile memory circuit which is capable of retaining stored data in the absence of a power supply voltage.

2. Description of the Related Art

Nonvolatile semiconductor memory devices, which can retain stored data even when power is turned off, conventionally include flash EEPROM employing a floating gate structure, FeRAM employing a ferroelectric film, MRAMs employing a ferromagnetic film, etc. There is a new type of nonvolatile semiconductor memory device called PermSRAM. PermSRAM uses a pair of MIS (metal-insulating film-semiconductor) transistors as a nonvolatile memory cell (i.e., the basic unit of data storage). The MIS transistors used as a nonvolatile memory cell in PermSRAM have the same structure as ordinary MIS transistors used for conventional transistor functions (e.g., switching function), and do not require a special structure such as a floating gate or a special material such as a ferroelectric material or ferromagnetic material. The absence of such a special structure and special material offers an advantage in cost reduction. PermSRAM was initially disclosed in PCT/JP2003/016143, which was filed on Dec. 17, 2003, the entire contents of which are hereby incorporated by reference.

The pair of MIS transistors used as a nonvolatile memory cell in PermSRAM are configured to selectively experience an irreversible hot-carrier effect on purpose for storage of one-bit data. Here, the irreversible hot-carrier effect refers to the injection of electrons into an oxide film of a selected transistor, which creates a shift in the threshold voltage of this transistor A difference in the transistor characteristics (i.e., difference in the threshold voltage) between the two MIS transistors caused by the hot-carrier effect represents one-bit data "0" or "1". Such a difference may be detected as a difference in the ON current between the two MIS transistors by using a sensing circuit such as a one-bit static memory circuit (latch) coupled to the MIS transistor pair.

There are many applications in which PermSRAM can be effectively utilized to provide cost advantages over other types of memories.

SUMMARY OF THE INVENTION

It is a general object of the present invention to provide a PermSRAM that is suitable for use for data authentication purpose.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

To achieve these and other advantages in accordance with the purpose of the invention, the invention provides a nonvolatile semiconductor memory device which includes a data input buffer configured to receive data from outside the nonvolatile semiconductor memory device, a nonvolatile memory cell including two MIS transistors to store first data received by the data input buffer by creating an irreversible change of transistor characteristics in one of the two MIS transistors, whichever is selected in response to a value of the first data, a sense latch coupled to the nonvolatile memory cell and configured to store the first data obtained by sensing a difference in the transistor characteristics between the two MIS transistors of the nonvolatile memory cell, and a logic circuit configured to produce a signal indicative of comparison between the first data stored in the sense latch and second data received by the data input buffer, the signal being output to outside the nonvolatile semiconductor memory device, wherein no data path to output the first data stored in the sense latch to outside the nonvolatile semiconductor memory device exists.

According to at least one embodiment of the present invention, data is first stored in the nonvolatile memory cell. Such nonvolatile data may be an identification code or the like for use for authentication purpose. When there is a need for authentication, a recall operation is performed to recall the identification code for storage in the sense latch, and, then, a code to be checked is supplied to the nonvolatile semiconductor memory device for comparison with the recalled identification code. The signal indicative of the comparison indicates a match only if the supplied code matches the identification code originally stored in the nonvolatile semiconductor memory device. Since there is no physical path to read stored data from outside the nonvolatile semiconductor memory device, the confidentiality of the stored data is safely protected.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

The present invention is directed to PermSRAM. Namely, a memory cell includes a pair of MIS (metal-insulating film-semiconductor) transistors that have the same structure as ordinary MIS transistors used for conventional transistor functions (e.g., switching function). Namely, these memory cell transistors use neither a special structure such as a floating gate nor a special material such as a ferroelectric material or a ferromagnetic material. These MIS transistors are configured to experience a hot-carrier effect on purpose for storage of one-bit data.

The hot-carrier effect leaves an irreversible lingering change in the transistor characteristics. Changes in the characteristics of the MIS transistors caused by the hot-carrier effect achieve a nonvolatile data retention. Which one of the MIS transistors has a strong lingering change determines whether the stored data is "0" or "1".

Further, a latch (flip-flop) circuit is used to determine data to be stored in the memory-cell MIS transistors. The latch circuit is also used to recall (sense) the data stored in the memory-cell MIS transistors. These latch circuits and the memory-cell MIS transistors together constitute a memory cell unit (memory circuit).

Figure 1:
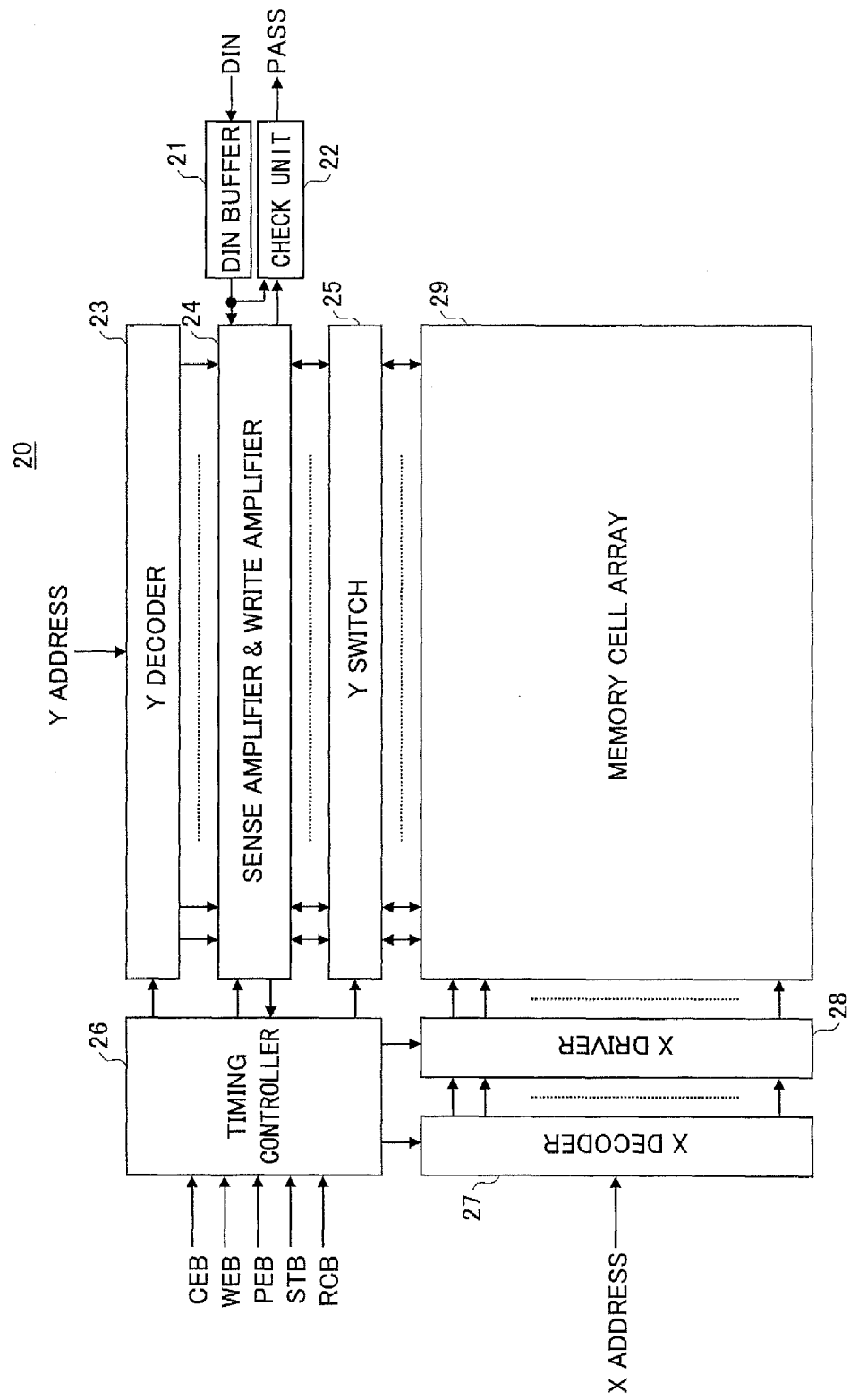
FIG. 1 is a block diagram showing a general configuration of a nonvolatile semiconductor memory device according to the present invention.

FIG. 1 is a block diagram showing a general configuration of a nonvolatile semiconductor memory device according to the present invention. A nonvolatile semiconductor memory device 20 shown in FIG. 1 includes a Din buffer 21, a check unit 22, a Y decoder 23, a write-amplifier-&-sense-amplifier unit 24, a Y switch 25, a timing controller 26, an X decoder 27, an X driver 28, and a memory cell array 29.

The memory cell array 29 includes a plurality of memory cell units arranged in a matrix form, with a plurality of word lines extending in a first direction, and a plurality of bit lines extending in a second direction perpendicular to the first direction. Each memory cell unit has a circuit configuration as will later be described. The memory cell units arranged in the same column (same Y address) are connected to the same bit lines, and the memory cell units arranged in the same row (same X address) are connected to the same word line.

The timing controller 26 receives control signals from an exterior of the device, and decodes the control signal to determine an operation mode (e.g., a write operation mode or a read operation mode). These control signals include a chip enable signal CEB, a write enable signal WEB, a pass output enable signal PEB, a store enable signal STB, and a recall enable signal RCB. Timing control signals responsive to the determined operation mode are supplied from the timing controller 26 to the Y decoder 23, the write-amplifier-&-sense-amplifier unit 24, the Y switch 25, the X decoder 27, the X driver 28, etc., for control of the individual parts of the semiconductor memory device 20.

The Y decoder 23 receives a Y address input from outside the nonvolatile semiconductor memory device 20, and decodes the Y address input to determine a selected column. The decode signals indicative of the selected column are supplied to the Y switch 25.

The X decoder 27 receives an X address input from outside the nonvolatile semiconductor memory device 20, and decodes the X address input to determine a selected row. The decode signals indicative of the selected row are supplied to the X driver 28.

In response to the timing control signals from the timing controller 26 and the decode signals from the X decoder 27, the X driver 28 activates a selected SRAM word line among the SRAM word lines extending from the X driver 28. As a result of the activation of the selected SRAM word line, volatile memory cells (i.e., the latch circuits of memory cells) are coupled to respective bit line pairs. Through this coupling, the writing/reading of data to/from the volatile memory cells is performed.

In response to the timing control signals from the timing controller 26 and the decode signals from the Y decoder 23, the Y switch 25 couples bit lines corresponding to the selected column to the write-amplifier-&-sense-amplifier unit 24. Through this coupling, data is transferred between the memory cell array 29 and the write-amplifier-&-sense-amplifier unit 24. In the write operation, input data supplied to the Din buffer 21 from outside the nonvolatile semiconductor memory device 20 is provided to the write-amplifier-&-sense-amplifier unit 24. Write amplifiers of the write-amplifier-&-sense-amplifier unit 24 amplify the input data to be written to the memory cell array 29. The amplified input data is then supplied to the memory cell array 29 via the Y switch 25. In the read operation, sense amplifiers of the write-amplifier-&-sense-amplifier unit 24 amplify the data read from the memory cell array 29 for provision to the check unit 22. The check unit 22 compares the data read from the memory cell array 29 with data that is currently input into the Din buffer 21. The check unit 22 outputs a signal PASS indicative of the results of the comparison.

It should be noted that there is neither an output buffer nor an output pin that outputs data retrieved from the memory cell array 29 to outside the nonvolatile semiconductor memory device 20. That is, there is no data path through which the data of the memory cell array 29 is supplied to outside the nonvolatile semiconductor memory device 20. Such configuration makes it impossible for any user to read data stored in the memory cell array 29 through ordinary means.

Figure 2:
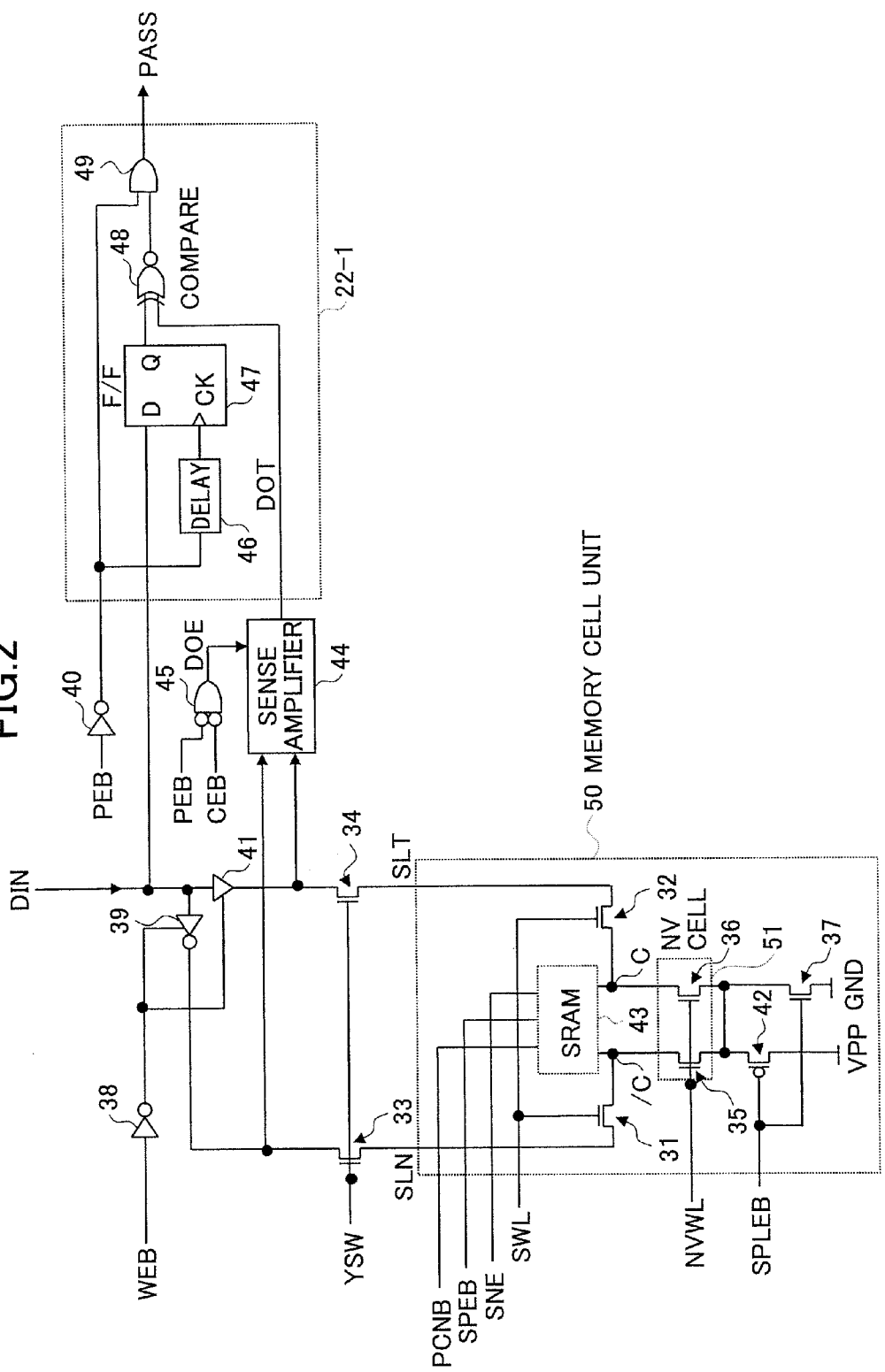
FIG. 2 is an illustrative drawing showing the configuration of a memory cell unit, a relevant portion of a check unit, and other relevant circuit parts of the nonvolatile semiconductor memory device of the present invention.

FIG. 2 is an illustrative drawing showing the configuration of a memory cell unit, a relevant portion of the check unit 22, and other relevant circuit parts of the nonvolatile semiconductor memory device of the present invention.

The configuration shown in FIG. 2 includes NMOS transistors 31 through 37, inverters 38 through 40, a buffer 41, a PMOS transistor 42, an SRAM cell 43, a sense amplifier 44, a NOR gate 45, a delay unit 46, a flip-flop 47, an NXOR gate 48, and an AND gate 49. The NMOS transistors 31, 32, 35 through 37, the PMOS transistor 42, and the SRAM cell 43 together constitute a memory cell unit 50. The inverter 39 and the buffer 41 constitute a write buffer that is part of the sense-amplifier-&-write-amplifier unit 24. The sense amplifier 44 is also part of the sense-amplifier-&-write-amplifier unit 24. The NMOS transistors 33 and 34 are part of the Y switch 25, and are made conductive when they are selected by a specified Y address. The delay unit 46, the flip-flop 47, the XOR gate 51, and the AND gate 49 together constitute a one-bit-check unit 22-1 that is part of the check unit 22.

SRAM data lines (bit lines) SLN and SLT connect between the sense-amplifier-&-write-amplifier unit 24 and the memory cell unit 50. Specifically, the SRAM data lines SLN and SLT are coupled to the SRAM cell 43 via the NMOS transistors 31, and 32, respectively. The SRAM cell 43 stores one-bit data supplied through the SRAM data lines SLN and SLT.

A pair of NMOS transistors 35 and 36 constitutes an NV cell 51, which serves as a nonvolatile memory cell for storing one-bit data. The NV cell 51 is connected to the SRAM cell 43. The SRAM cell 43 serves as a latch circuit for storing one-bit data to be stored in the NV cell 51, and also serves as a sense circuit to sense data stored in the NV cell 51.

Figure 3:
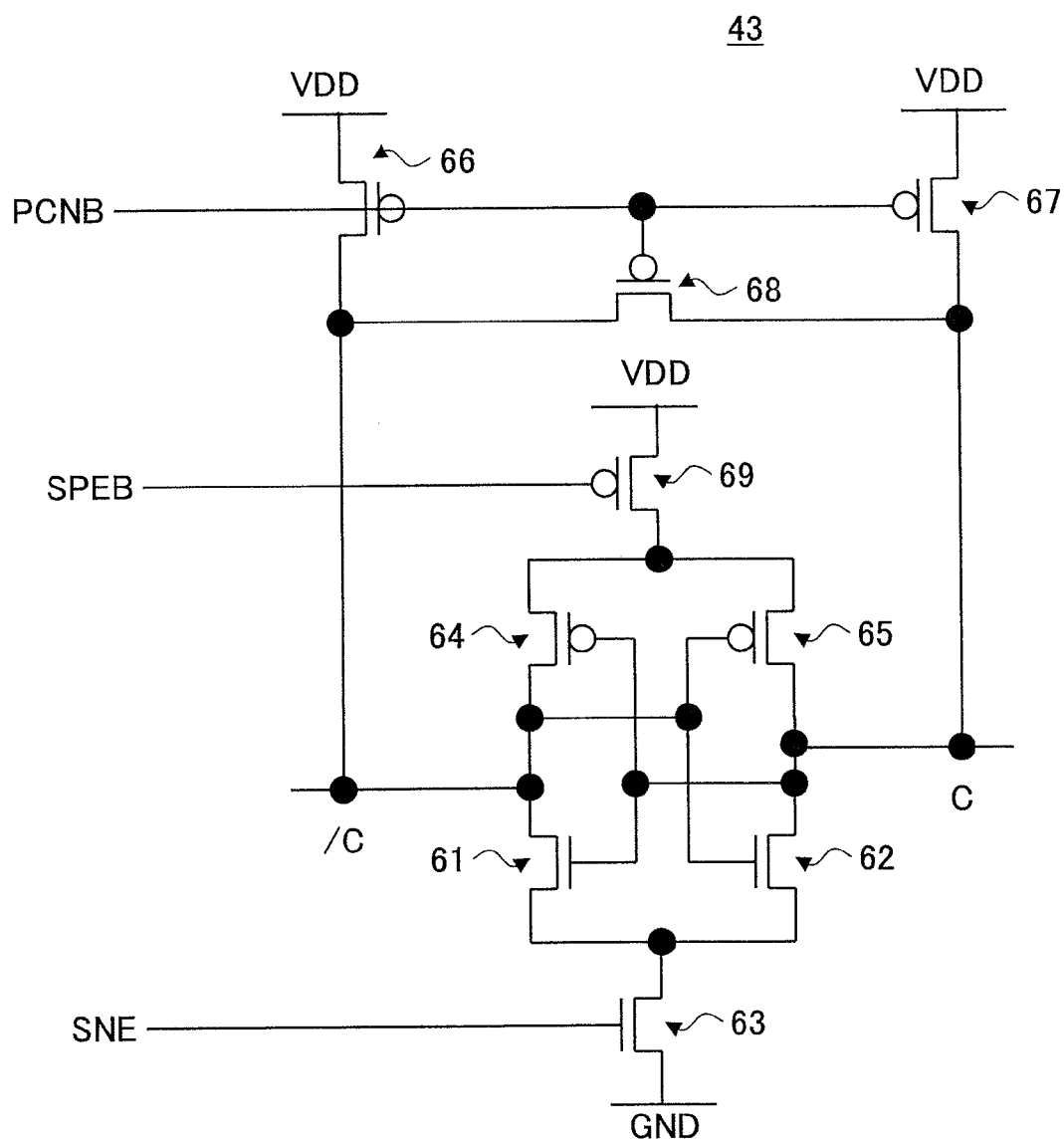
FIG. 3 is a drawing showing an example of the configuration of an SRAM cell.

FIG. 3 is a drawing showing an example of the configuration of the SRAM cell 43. The SRAM cell 43 shown in FIG. 3 includes NMOS transistors 61 through 63 and PMOS transistors 64 through 69. An inverter comprised of the NMOS transistor 61 and the PMOS transistor 64 is cross-coupled to an inverter comprised of the NMOS transistor 62 and the PMOS transistor 65, thereby forming a latch circuit for storing one-bit data supplied through the SRAM data lines SLN and SLT. This latch circuit also serves to amplify a voltage difference appearing between nodes C and /C in response to data stored in the NV cell 51.

Turning back to FIG. 2, the NMOS transistors 35 and 36 serving as nonvolatile memory cell transistors have the same structure as the other NMOS transistors such as the NMOS transistors 31, 32, and 37 as well as NMOS transistors used in the SRAM cell 43. Further, it is preferable to manufacture all the MOS transistors of the memory cell unit 50 with the same thickness of the gate oxide film. Namely, all the MOS transistors used in the memory cell unit 50 may be designed to operate with the same operating voltage (e.g., 1.8 V).

As shown in FIG. 2, the SRAM data lines SLN and SLT, which extend from the sense-amplifier-&-write-amplifier unit 24, are coupled to the SRAM cell 43 via the NMOS transistors 31 and 32. An SRAM word line SWL, which extends from the X driver 28, is connected to the gates of the NMOS transistors 31 and 32. An NV word line NVWL, which extends from the X driver 28, is coupled to the gate nodes of the NMOS transistors 35 and 36 serving as the nonvolatile memory cell.

Further, a cell precharge line PCNB and SRAM NMOS enable line SNE which extend from the X driver 28 are connected to the SRAM cell 43. Specifically, as shown in FIG. 3, the cell precharge line PCNB is coupled to the gates of the PMOS transistors 66 through 68 for the purpose of precharging and equalizing the node C and /C. The SRAM NMOS enable line SNE is coupled to the gate of the NMOS transistor 63 so as to control the on/off state of the SRAM cell 43.

Turning back to FIG. 2, a store plate voltage enable line SPLEB which extends from the X driver 28 is coupled to the gate of the NMOS transistor 37 and to the gate of the PMOS transistor 42. In response to the LOW state of the store plate voltage enable line SPLEB, a high voltage VPP is applied to the NV cell 51, so that the data stored in the SRAM cell 43 is stored in the NV cell 51. This is done by creating a hot-carrier-effect-based change in transistor characteristics with respect to either the NMOS transistor 35 or the NMOS transistor 36, whichever is selected by the data stored in the SRAM cell 43. Namely, one of the NMOS transistors 35 and 36 whose source node is set at the LOW level will experience a hot-carrier effect while the other one does not experience a hot-carrier effect.

In response to the HIGH state of the store plate voltage enable line SPLEB, the data stored in the NV cell 51 is recalled, i.e., the data stored in the NV cell 51 is transferred to the SRAM cell 43. In this recall operation, the SRAM NMOS enable line SNE is first set to LOW to make the NMOS transistor 63 (see FIG. 3) nonconductive, thereby placing the SRAM cell 43 in an inactive state. The cell precharge line PCNB is then set to LOW to precharge and equalize the node C and /C of the SRAM cell 43 (see FIG. 3). After this, the store plate voltage enable line SPLEB is set to HIGH to make the NMOS transistor 37 conductive, followed by setting the SRAM NMOS enable line SNE to HIGH to activate the SRAM cell 43. The SRAM cell 43 amplifies a voltage difference appearing between the node C and /C in response to a difference in the threshold voltages between the NMOS transistors 35 and 36.

Figure 4:
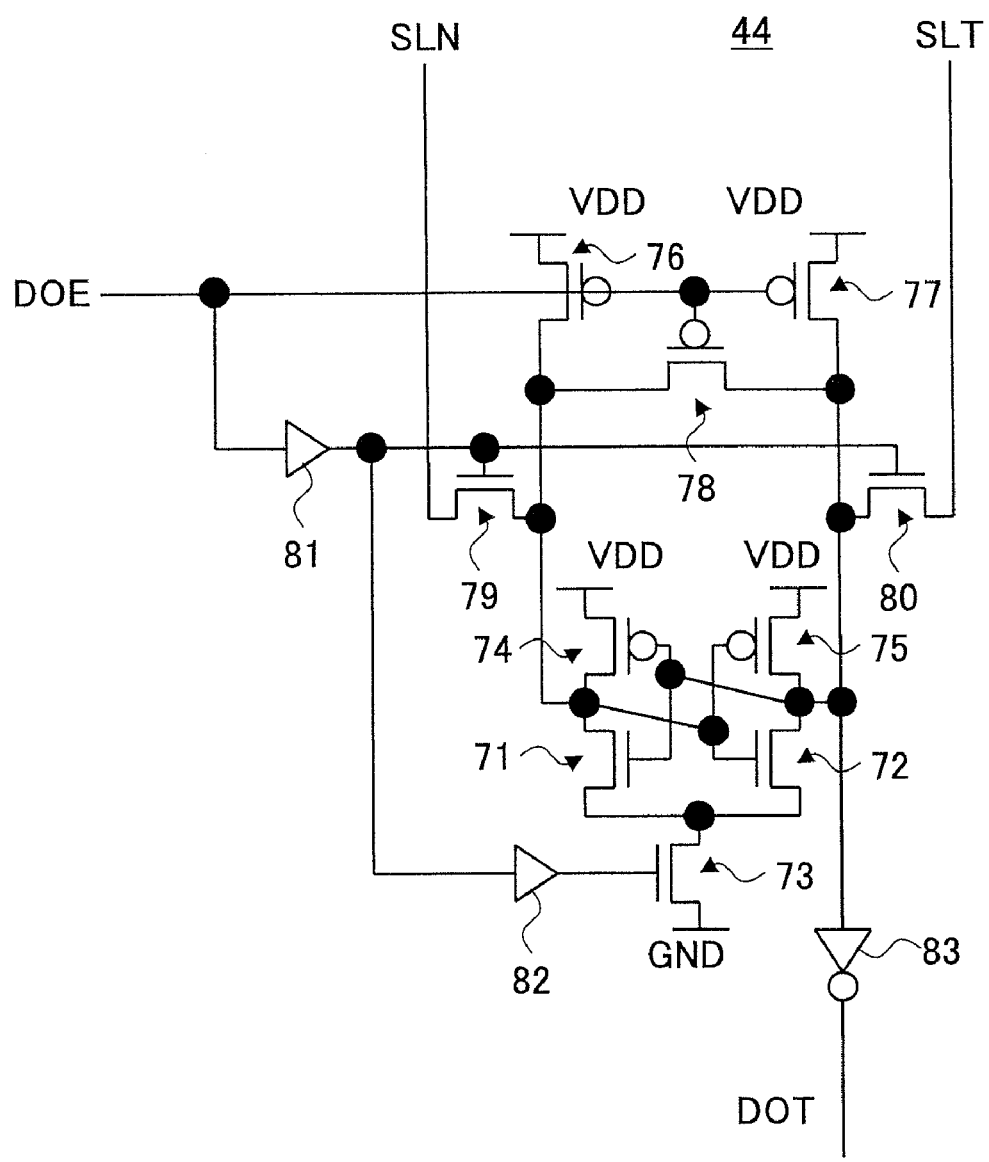
FIG. 4 is a drawing showing an example of the circuit configuration of a sense amplifier.

In the present invention, the data stored in the SRAM cell 43 through recall operation is transferred to the sense amplifier 44 through the NMOS transistors 33 and 34, which are part of the Y switch 25. FIG. 4 is a drawing showing an example of the circuit configuration of the sense amplifier 44. As shown in FIG. 4, the sense amplifier 44 includes NMOS transistors 71 through 73, PMOS transistors 74 through 78, NMOS transistors 79 and 80, buffers 81 and 82, and an inverter 83. When either the pass output enable signal PEB or the chip enable signal CEB is HIGH (see FIG. 2), DOE becomes LOW to make the PMOS transistors 76 through 78 conductive to equalize and precharge the sense amplifier 44. When both the pass output enable signal PEB and the chip enable signal CEB is set to LOW, DOE becomes HIGH to activate the sense amplifier 44.

Due to the nature of the store and recall operation, HIGH data DIN (i.e., HIGH on the SRAM data line SLT and LOW on the SRAM data line SLN) written to the SRAM cell 43 and stored in the NV cell 51 will appear as LOW data (i.e., LOW on the SRAM data line SLT and HIGH on the SRAM data line SLN) when the data is recalled from the NV cell 51 to the SRAM cell 43. Considering such data inversion, the inverter 83 shown in FIG. 4 inverts the data recalled from the NV cell 51, so that data DOT output from the sense amplifier 44 should be the same logic as the data DIN that was originally written to the SRAM cell 43.

Data DIN that is currently supplied from outside the nonvolatile semiconductor memory device 20 via the Din buffer 21 (see FIG. 1) is loaded to the flip-flop 47 in response to the pass output enable signal PEB. The data DIN stored in the flip-flop 47 and the data DOT output from the sense amplifier 44 are compared by the NXOR gate 48. If these two compared bits are the same, the NXOR gate 48 produces a HIGH output, which is output from the one-bit-check unit 22-1 as a signal PASS.

Figure 5:
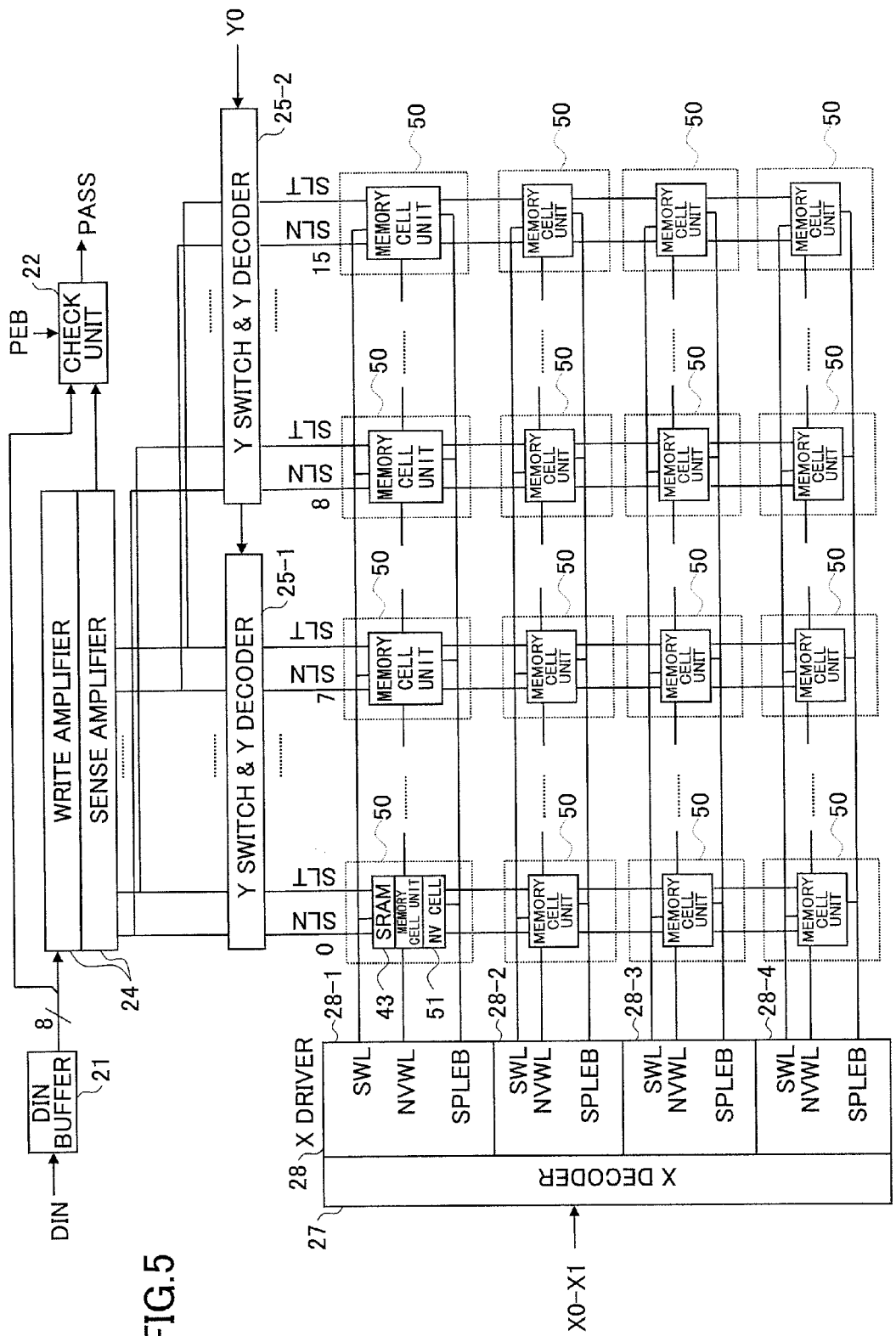
FIG. 5 is a drawing showing the configuration of a first embodiment of the nonvolatile semiconductor memory device according to the present invention.

FIG. 5 is a drawing showing the configuration of a first embodiment of the nonvolatile semiconductor memory device according to the present invention. In FIG. 5, the same elements as those of FIG. 1 and FIG. 2 are referred to by the same numerals, and a description thereof will be omitted. In FIG. 5, the illustration of the timing controller 26 is omitted for the sake of simplicity of illustration.

The X driver 28 includes X driver units 28-1 through 28-4 which are identical to one another in terms of circuit configuration. Each one of the X driver units 28-1 through 28-4 supplies a set of signals SWL, NVWL, and SPLEB, and also supplies other signals such as PCNB (not shown) as appropriate.

An address signal X0-X1 supplied to the X decoder 27 may be comprised of 2 bits, for example, to select one of the X driver units 28-1 through 28-4, the number of which is 4 in this example. The memory cell array 29 shown in FIG. 1 corresponds to a plurality of memory cell units 50, the SRAM data lines SLN and SLT extending from the sense-amplifier-&-write-amplifier unit 24 (via Y-decoder-&-Y-switch units 25-1 and 25-2), and signal lines extending from the X driver units 28-1 through 28-4. Each of the memory cell units 50 has the configuration as shown in FIG. 2, and includes the SRAM cell 43 and the NV cell 51, which are illustrated in FIG. 5 only with respect to the representative one of the memory cell units 50 shown at the top left corner.

One of the X driver units 28-1 through 28-4 selected by the X decoder 27 activates the SRAM word line SWL to write/read data to/from the SRAM cells 43 with respect to the memory cell units 50 that are connected to the activated SRAM word line SWL. Data transfer between the sense-amplifier-&-write-amplifier unit 24 and the SRAM cell 43 is conducted via the SRAM data lines SLN and SLT and the Y-decoder-&-Y-switch units 25-1 and 25-2. The Y-decoder-&-Y-switch units 25-1 and 25-2 correspond to the Y decoder 23 and the Y switch 25. In the example shown in FIG. 5, a Y address Y0 is comprised of one bit to indicate one of the two columns wherein the first column is comprised of bits 0 through 7 shown in FIG. 5 corresponding to the Y-decoder-&-Y-switch unit 25-1, and the second column is comprised of bits 8 through 15 shown in FIG. 5 corresponding to the Y-decoder-&-Y-switch unit 25-2. The Din buffer 21 and the sense-amplifier-&-write-amplifier unit 24 have a data width of 8 bits, and this 8-bit data is written/read to/from the memory cell units 50 via a selected one of the Y-decoder-&-Y-switch units 25-1 and 25-2.

Figure 6:
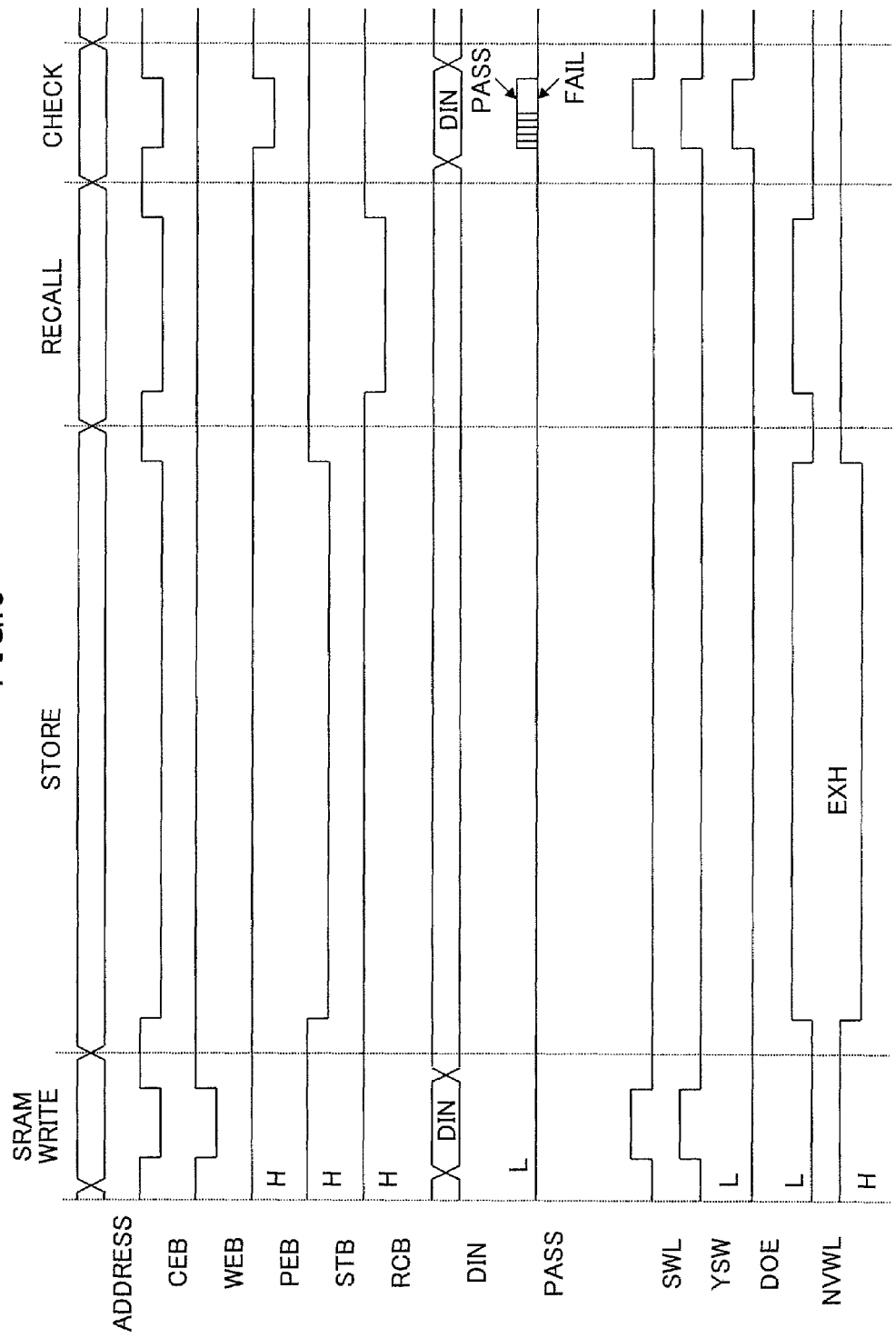
FIG. 6 is a timing chart for explaining operations of the nonvolatile semiconductor memory device shown in FIG. 5.

FIG. 6 is a timing chart for explaining operations of the nonvolatile semiconductor memory device shown in FIG. 5.

The first operation shown in FIG. 6 is an SRAM write operation that writes data to specified SRAM cells 43. The store enable signal STB, the pass output enable signal PEB, and the recall enable signal RCB are kept at HIGH, and the write enable signal WEB and the chip enable signal CEB are set to LOW to specify write timing. At this write timing, an address and data are supplied to the nonvolatile semiconductor memory device.

Referring to FIG. 5, the X address X0-X1 is supplied to the X decoder 27, and the Y address Y0 is supplied to the Y-decoder-&-Y-switch units 25-1 and 25-2. The input data DIN is supplied to the Din buffer 21. In response to the supplied X address, the X driver unit 28-1, for example, is selected by the X decoder 27 to activate the SRAM word line SWL extending from the X driver unit 28-1. In response to the supplied Y address Y0, the Y-decoder-&-Y-switch unit 25-1, for example, couples the sense-amplifier-&-write-amplifier unit 24 to the memory cell units 50 corresponding to data bits 0 through 7 shown in FIG. 5. The activation of the SRAM word line SWL to HIGH causes the input data to be written to the SRAM cells 43 of the memory cell units 50 corresponding to the data bits 0 through 7 shown in FIG. 5.

Figure 7:
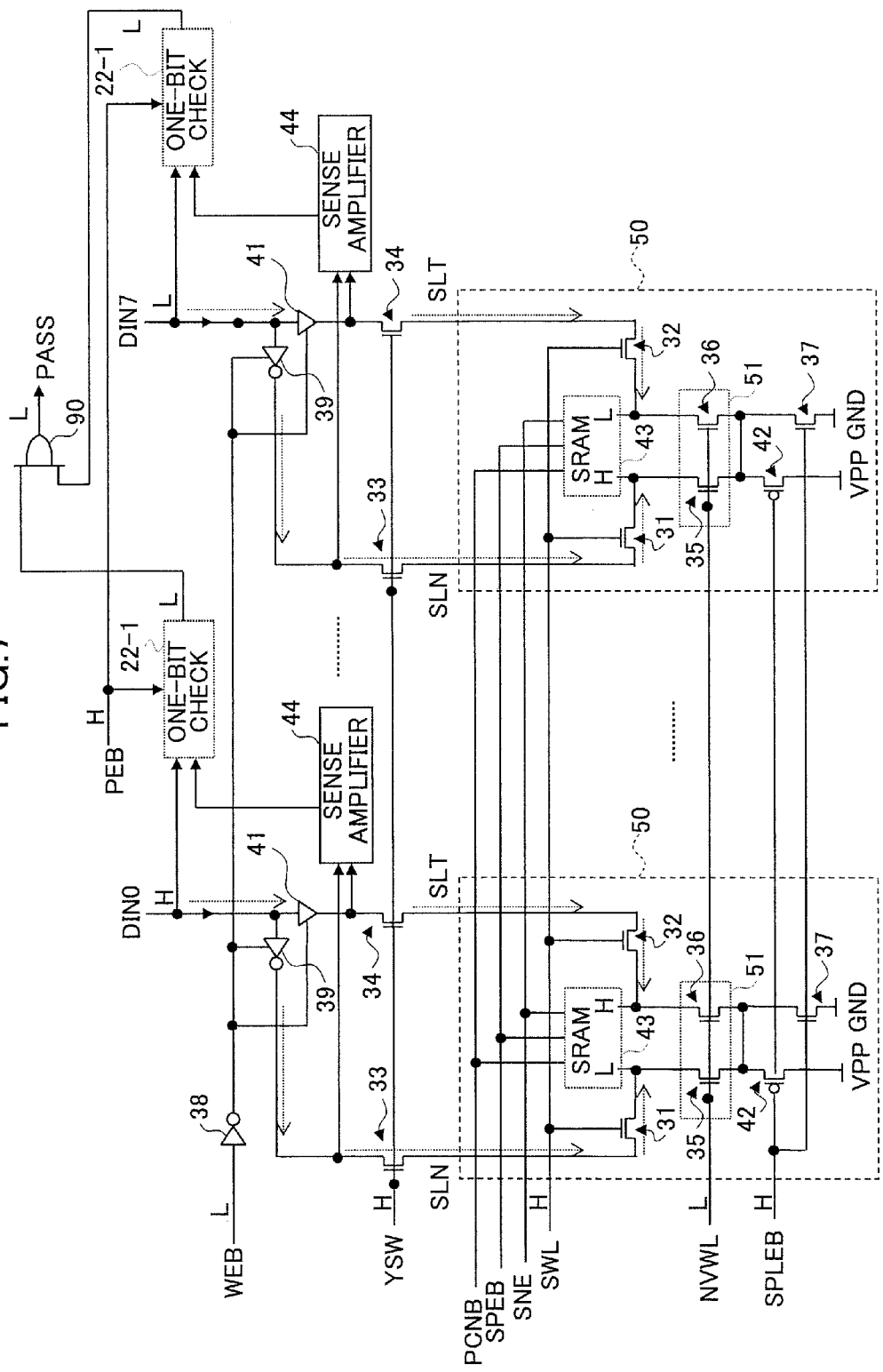
FIG. 7 is a drawing for explaining an SRAM write operation.

FIG. 7 is a drawing for explaining the SRAM write operation. A plurality of memory cell units 50 shown in FIG. 7 corresponds to one of the four rows selected by the X address and one of the two columns selected by the Y address as shown in FIG. 5. That is, there are supposed to be 8 memory cell units 50 in the configuration shown in FIG. 7, some of which are omitted in the illustration for the sake of simplicity.

As shown in FIG. 7, the NMOS transistors 31 and 32 are made conductive in response to the HIGH state of the SRAM word line SWL. As a result, data supplied through the SRAM data lines SLN and SLT are stored in the SRAM cells 43. In this example, input data bit DIN0 that is "H" (i.e., HIGH level) is stored in the SRAM cell 43 of a corresponding one (leftmost bit) of the memory cell units 50, and input data bit DIN7 that is "L" (i.e., LOW level) is stored in the SRAM cell 43 of a corresponding one (rightmost bit) of the memory cell units 50.

Figure 8:
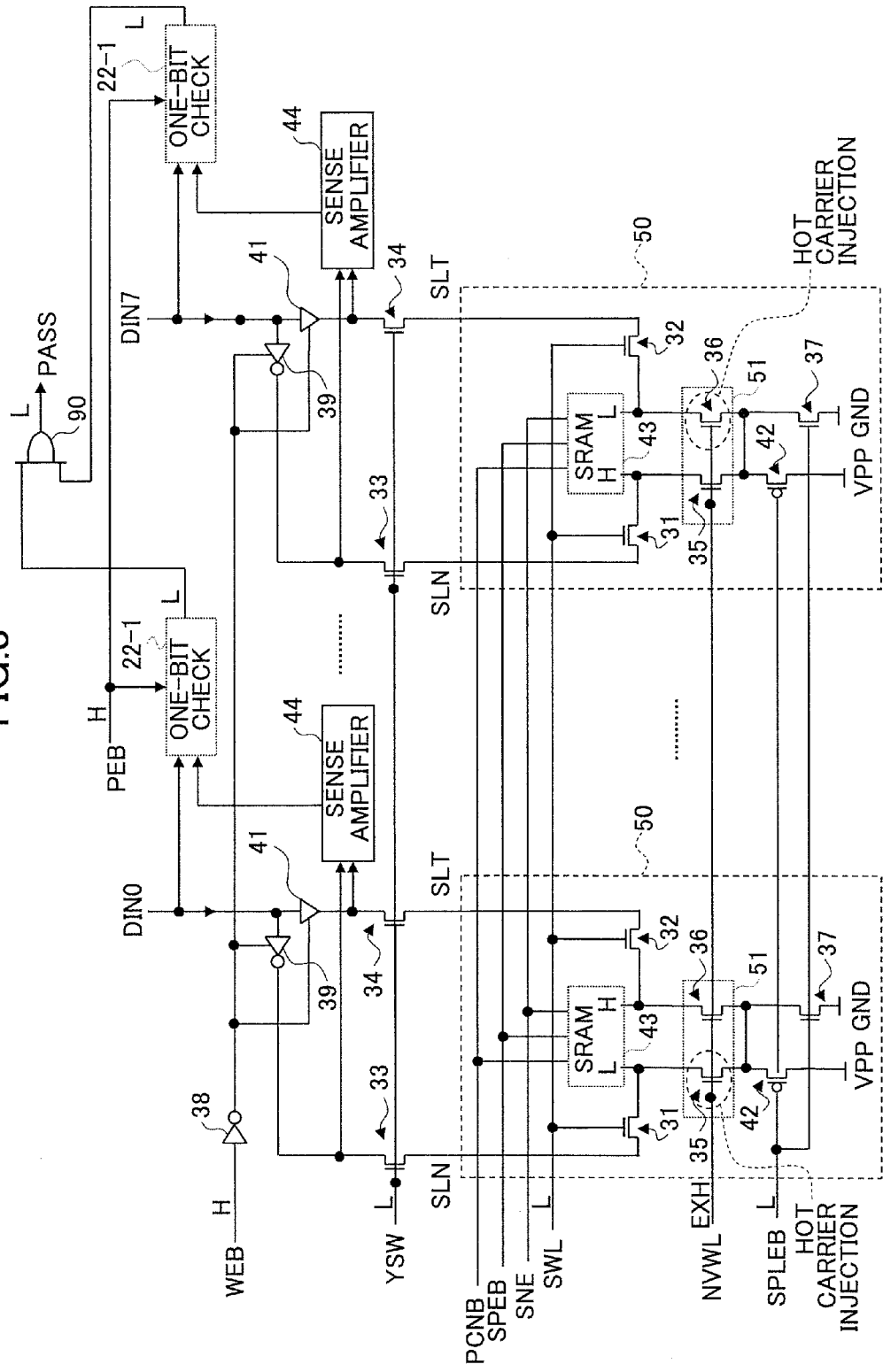
FIG. 8 is a drawing for explaining a store operation.

Turning back to FIG. 6, the second operation shown in FIG. 6 is a store operation that stores the data of the SRAM cells 43 in the NV cells 51. The store enable signal STB and the chip enable signal CEB are set to LOW while the pass output enable signal PEB, the recall enable signal RCB, and the write enable signal WEB are set to HIGH. FIG. 8 is a drawing for explaining the store operation. In FIG. 8, the same elements as those of FIG. 7 are referred to by the same numerals, and a description thereof will be omitted.

As shown in FIG. 8, the store plate voltage enable line SPLEB is set to LOW to make the PMOS transistor 42 conductive, thereby applying the high voltage VPP (e.g., 3.3 V) to the NV cells 51. The NV word line NVWL is set to EXH (e.g., 1.65 V), which is determined such as to maximize the effect of a hot-carrier phenomenon. Generally, such potential is selected to be half the voltage between the source node and drain node of the transistor that is subjected to a hot-carrier effect.

With the signal level settings as described above, with respect to each of the memory cell units 50, a voltage of 3.3 V between VPP and the LOW level (i.e., 0 V) is applied between the drain node and source node of one of the NMOS transistors 35 and 36, whichever is selected according to the data stored in the SRAM cell 43. In the example shown in FIG. 8, the selected one of the NMOS transistors is the NMOS transistor 35 in the leftmost bit of the memory cell units 50, and the selected one of the NMOS transistors is the NMOS transistor 36 in the rightmost bit of the memory cell units 50.

Further, a voltage of 1.65 V between the NV word line potential and the LOW level is applied between the gate nodes and source nodes of the above-noted selected NMOS transistors. Since these bias voltages are larger than the voltages used in routine operations, the selected NMOS transistors experience a strong hot-carrier effect. In the leftmost memory cell unit 50 shown in FIG. 8, only the NMOS transistor 35 experiences a hot-carrier effect while the NMOS transistor 36 does not experience a hot-carrier effect. In the rightmost memory cell unit 50 shown in FIG. 8, only the NMOS transistor 36 experiences a hot-carrier effect while the NMOS transistor 35 does not experience a hot-carrier effect.

Turning back to FIG. 6, the third operation shown in FIG. 6 is a recall operation that recalls the data stored in the NV cells 51 for storage in the SRAM cells 43. The store enable signal STB, the pass output enable signal PEB, and the write enable signal WEB are kept at HIGH, and the recall enable signal RCB and the chip enable signal CEB are set to LOW to indicate a recall operation.

Figure 9:
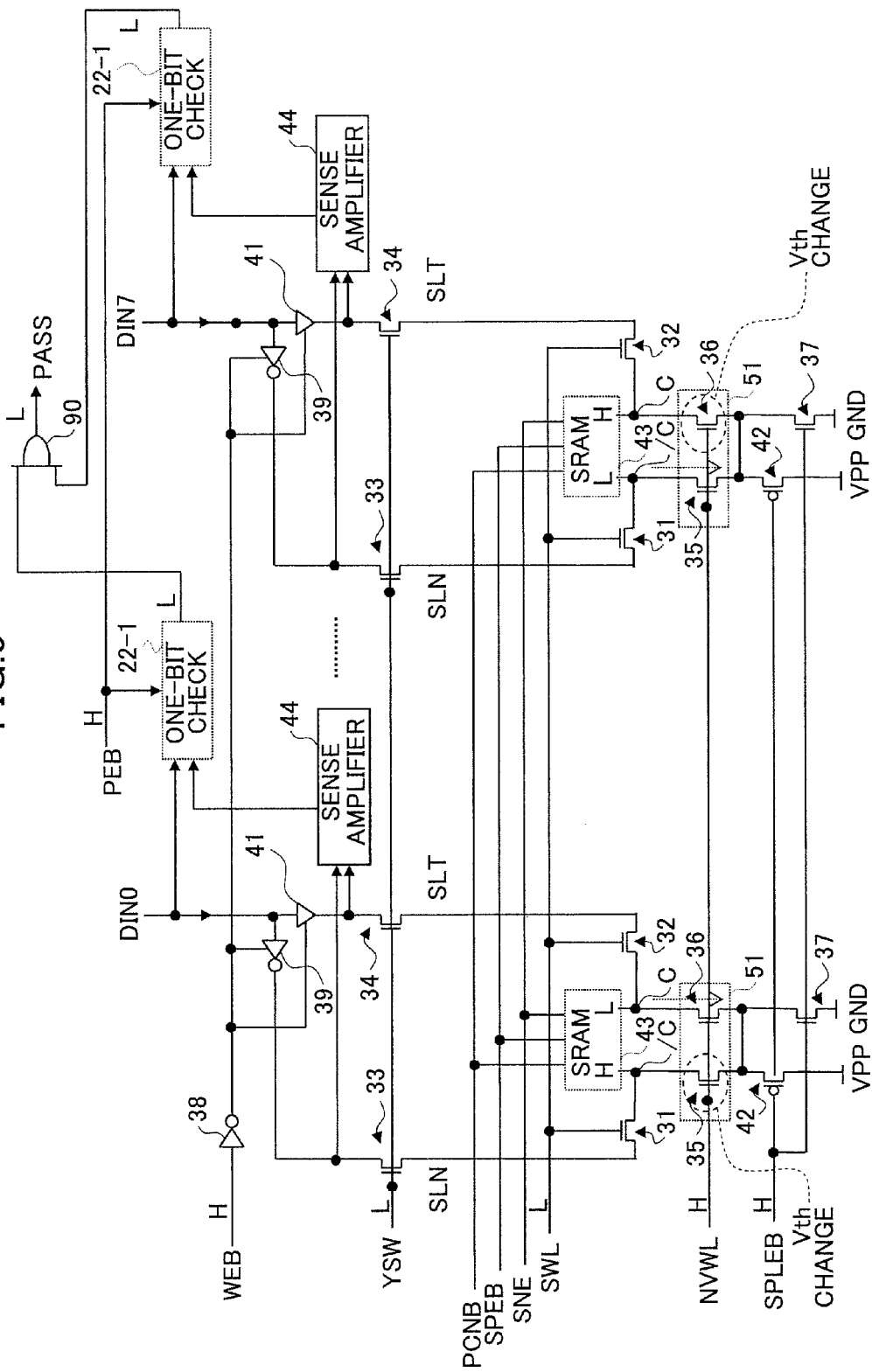
FIG. 9 is a drawing for explaining a recall operation.

FIG. 9 is a drawing for explaining the recall operation. As shown in FIG. 9, with the store plate voltage enable line SPLEB being set to HIGH, the NV word line NVWL is set to HIGH to activate the NMOS transistors 35 and 36 of the NV cells 51. In order to recall the data from the NV cells 51, the SRAM cells 43 is initially placed in an electrically inactive state, and is then shifted to an electrically active state. This is achieved by changing both the cell precharge signal PCNB and the SRAM NMOS enable signal SNE (see FIG. 3) from LOW to HIGH. Prior to the activation of the buffer 44, the NV word line NVWL is set to HIGH (e.g., 1.8 V) as shown in FIG. 9.

With respect to the leftmost memory cell unit 50 in this example, the NMOS transistor 35 has a change in the transistor characteristics (i.e., change in the threshold voltage) due to a hot-carrier effect whereas the NMOS transistor 36 does not have such a change in the transistor characteristics. The force that pulls down the electrical node /C is thus weaker than the force that pulls down the electrical node C. After the activation of the SRAM cell 43, therefore, the electrical node /C is set to the HIGH level, and the electrical node C is set to the LOW level.

With respect to the rightmost memory cell unit 50 in this example, the NMOS transistor 36 has a change in the transistor characteristics (i.e., change in the threshold voltage) due to a hot-carrier effect whereas the NMOS transistor 35 does not have such a change in the transistor characteristics. The force that pulls down the electrical node C is thus weaker than the force that pulls down the electrical node /C. After the activation of the SRAM cell 43, therefore, the electrical node C is set to the HIGH level, and the electrical node /C is set to the LOW level.

Turning back to FIG. 6, the fourth operation shown in FIG. 6 is a check operation (authentication operation) that checks the sameness of data input into the nonvolatile semiconductor memory device and data recalled from the NV cells 51. The store enable signal STB, the recall enable signal RCB, and the write enable signal WEB are kept at HIGH, and the chip enable signal CEB and the pass output enable signal PEB are set to LOW to indicate a check operation. During this check operation, an address and data Din are supplied from a host device to the nonvolatile semiconductor memory device.

Referring to FIG. 5, the X address X0-X1 is supplied to the X decoder 27, and the Y address Y0 is supplied to the Y-decoder-&-Y-switch units 25-1 and 25-2. In response to the supplied X address, the X driver unit 28-1, for example, is selected by the X decoder 27 to activate the SRAM word line SWL extending from the X driver unit 28-1. In response to the supplied Y address, the Y-decoder-&-Y-switch unit 25-1, for example, couples the sense-amplifier-&-write-amplifier unit 24 to the memory cell units 50 corresponding to data bits 0 through 7 shown in FIG. 5. The activation of the SRAM word line SWL to HIGH causes the data of the SRAM cells 43 to be read from the memory cell units 50 corresponding to the data bits 0 through 7 shown in FIG. 5, and supplied to the check unit 22 via the sense-amplifier-&-write-amplifier unit 24.

Figure 10:
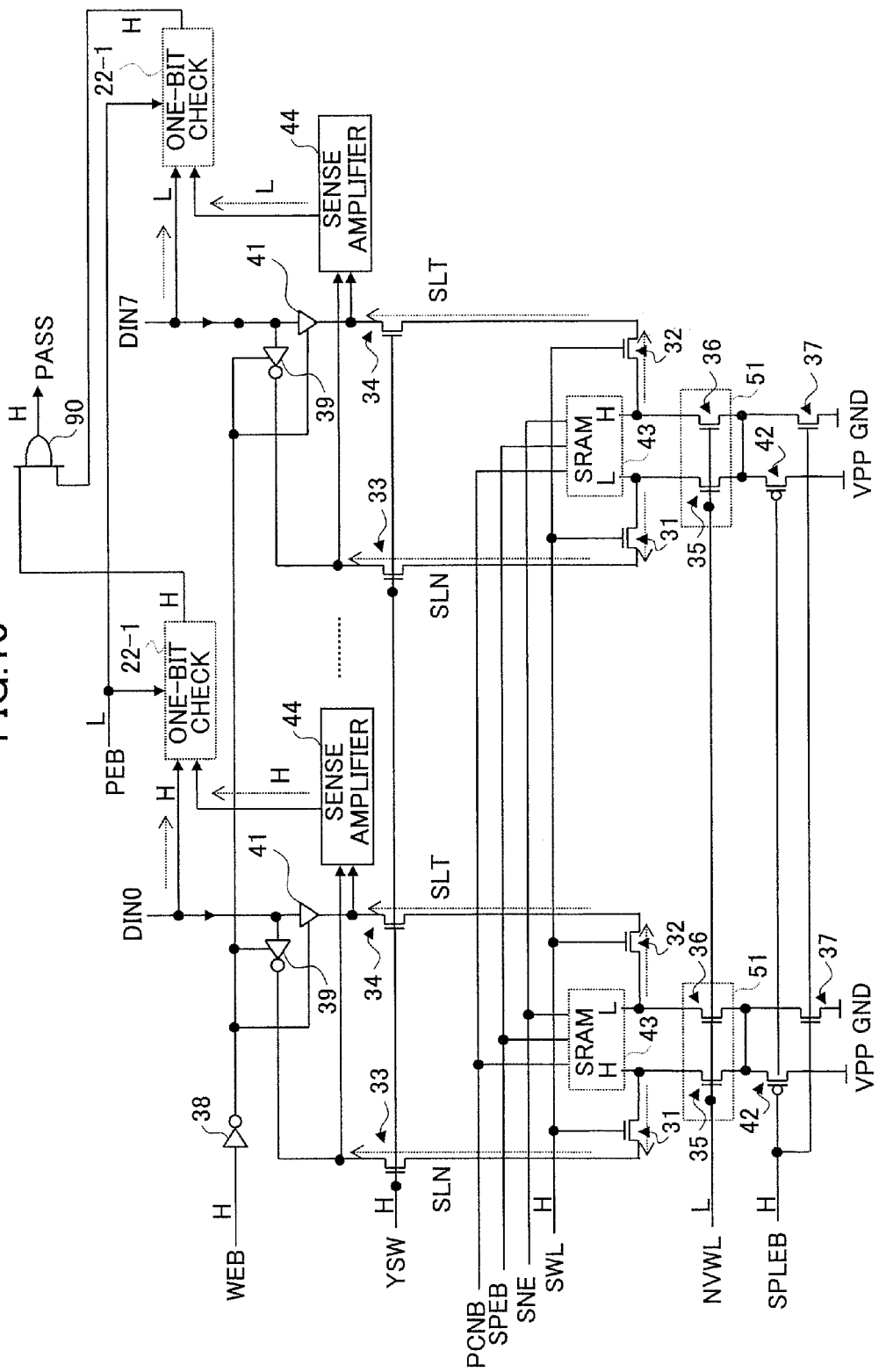
FIG. 10 is a drawing for explaining a check operation.

FIG. 10 is a drawing for explaining the check operation. As shown in FIG. 10, the SRAM word line SWL is set to HIGH to make the NMOS transistors 31 and 32 conductive, so that the data stored in the SRAM cells 43 are stored and amplified in the sense amplifiers 44 for provision to the one-bit-check units 22-1. In the example shown in FIG. 10, the data bit output from the sense amplifier 44 with respect to the leftmost memory cell unit 50 is HIGH. It should be noted that the input data bit DIN0 originally written to the SRAM cell 43 is HIGH as shown in FIG. 7, but the corresponding data bit read from the SRAM cell 43 in the check operation following a recall operation is LOW as shown in FIG. 10. As was previously described, the inverter 83 of the sense amplifier 44 shown in FIG. 4 inverts the data recalled from the NV cell 51, so that the data output from the sense amplifier 44 is the same logic as the data DIN0 that was originally written to the SRAM cell 43. By the same token, the data output from the sense amplifier 44 corresponding to the rightmost memory cell unit 50 is LOW, which is the same as the data bit DIN7 as originally written to the SRAM cell 43 shown in FIG. 7.

As previously described in connection with FIG. 2, each one-bit-check unit 22-1 illustrated in FIG. 10 compares the input data as currently supplied from outside the nonvolatile semiconductor memory device with the data supplied from the sense amplifier 44. If the data comparison indicates a match, the one-bit-check unit 22-1 produces a HIGH output. If every and each one-bit-check unit 22-1 outputs HIGH, the AND gate 90 produces a HIGH output as the signal PASS indicative of the results of the comparison. This signal PASS is output from the check unit 22 to outside the nonvolatile semiconductor memory device as shown in FIG. 5.

In the manner as described above, data is first written into the nonvolatile semiconductor memory device in an SRAM write operation, and is then stored as nonvolatile data in a store operation. Such nonvolatile data may be an identification code or the like for use for authentication purpose. When there is a need for authentication, a recall operation is performed to recall the identification code, and, then, a code to be checked is supplied to the nonvolatile semiconductor memory device for comparison with the recalled identification code. The signal PASS output from the nonvolatile semiconductor memory device indicates a match only if the supplied code matches the identification code originally stored in the nonvolatile semiconductor memory device. Since there is no physical path to read stored data from outside the nonvolatile semiconductor memory device, the confidentiality of the stored data is safely protected.

Figure 11:
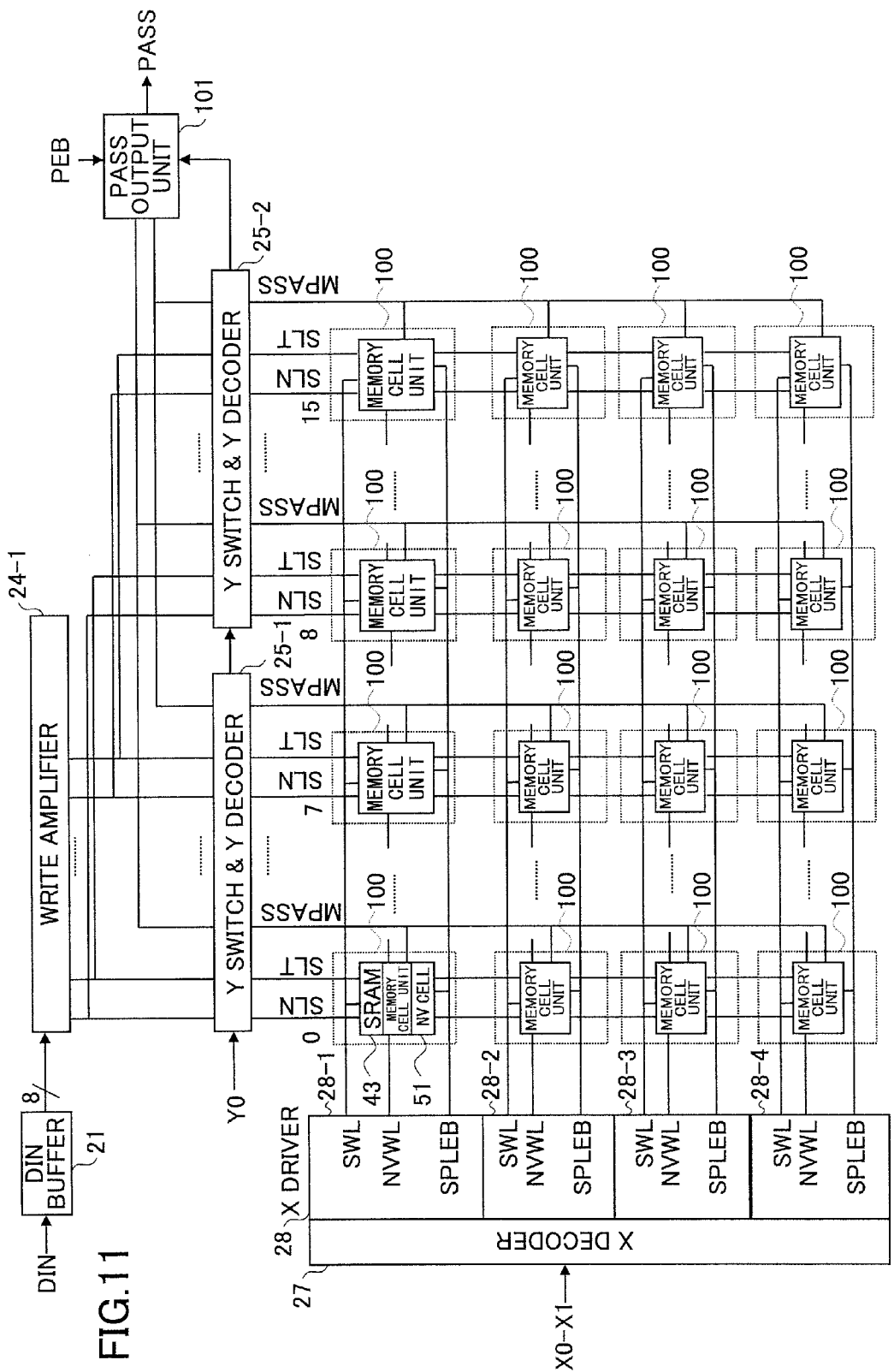
FIG. 11 is a drawing showing the configuration of a second embodiment of the nonvolatile semiconductor memory device according to the present invention.

FIG. 11 is a drawing showing the configuration of a second embodiment of the nonvolatile semiconductor memory device according to the present invention. In FIG. 11, the same elements as those of FIG. 1, FIG. 2, and FIG. 5 are referred to by the same numerals, and a description thereof will be omitted. In FIG. 11, the illustration of the timing controller 26 is omitted for the sake of simplicity of illustration.

The configuration shown in FIG. 11 differs from the configuration shown in FIG. 5 mainly in that the comparison function to compare input data with stored data is incorporated in each of a plurality of memory cell units 100. A pass output unit 101 is provided for the purpose of consolidating the check results supplied from a plurality of memory cell units 100. In this configuration, the sense amplifiers of the sense-amplifier-&-write-amplifier unit 24 shown in FIG. 5 (i.e., the sense amplifiers 44 shown in FIG. 7, for example) are no longer necessary. In FIG. 11, thus, sense amplifiers are not provided, and a write amplifier unit 24-1 is provided in place of the sense-amplifier-&-write-amplifier unit 24.

Figure 12:
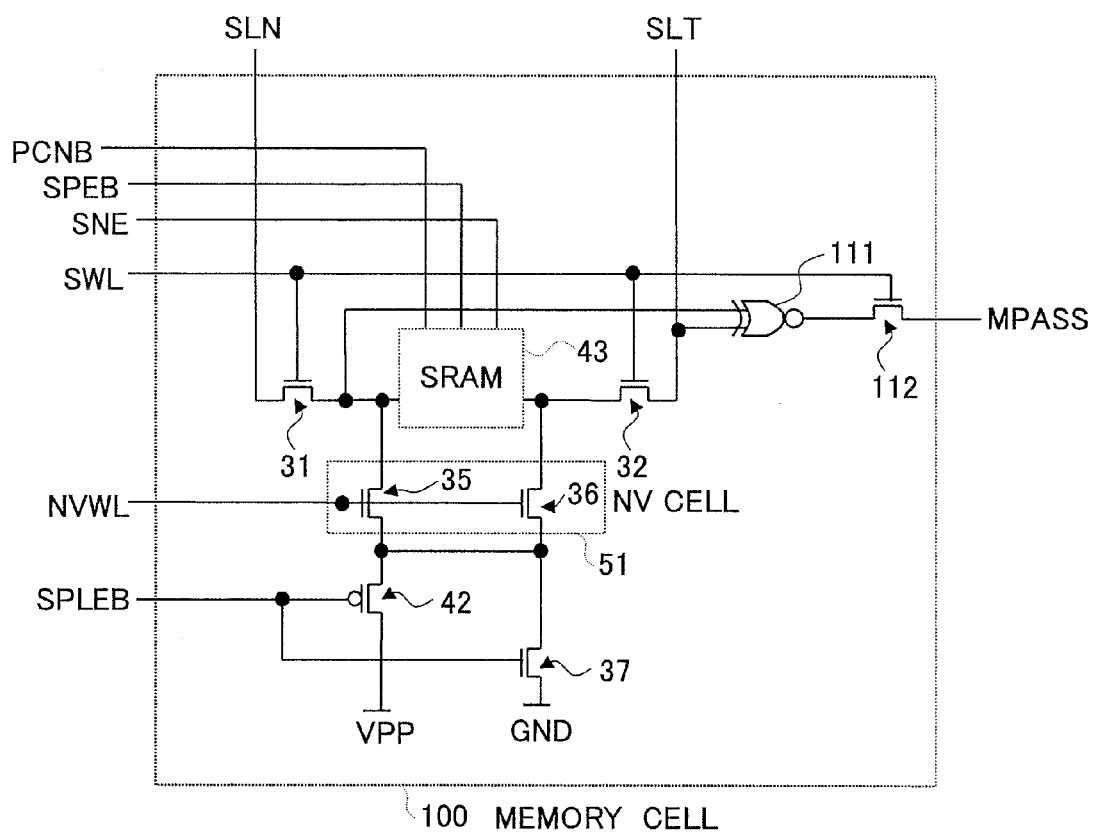
FIG. 12 is a drawing showing an example of the configuration of a memory cell unit shown in FIG. 11.

FIG. 12 is a drawing showing an example of the configuration of the memory cell unit 100. In FIG. 12, the same elements as those of FIG. 2 are referred to by the same numerals, and a description thereof will be omitted.

The memory cell unit 100 of FIG. 12 includes the NMOS transistors 31, 32, 35 through 37, the PMOS transistor 42, the SRAM cell 43, an NXOR gate 111, and an NMOS transistor 112. The NXOR gate 111 compares a stored and recalled data bit on the SLN side with a currently supplied data bit on the SLT side. The output of the NXOR gate 111 is HIGH if the stored data and the currently supplied data are the same, and is LOW if the stored data and the currently supplied data are different. The output of the NXOR gate 111 is electrically coupled to a signal line MPASS only when the corresponding SRAM word line SWL is set to HIGH. As shown in FIG. 11, a signal line MPASS extends parallel to the SRAM data lines SLN and SLT, and is connected to the memory cell units 100 arranged at the corresponding bit position. The signal lines MPASS corresponding to respective bit positions are coupled to the pass output unit 101 via the Y-decoder-&-Y-switch units 25-1 and 25-2.

Figure 13:
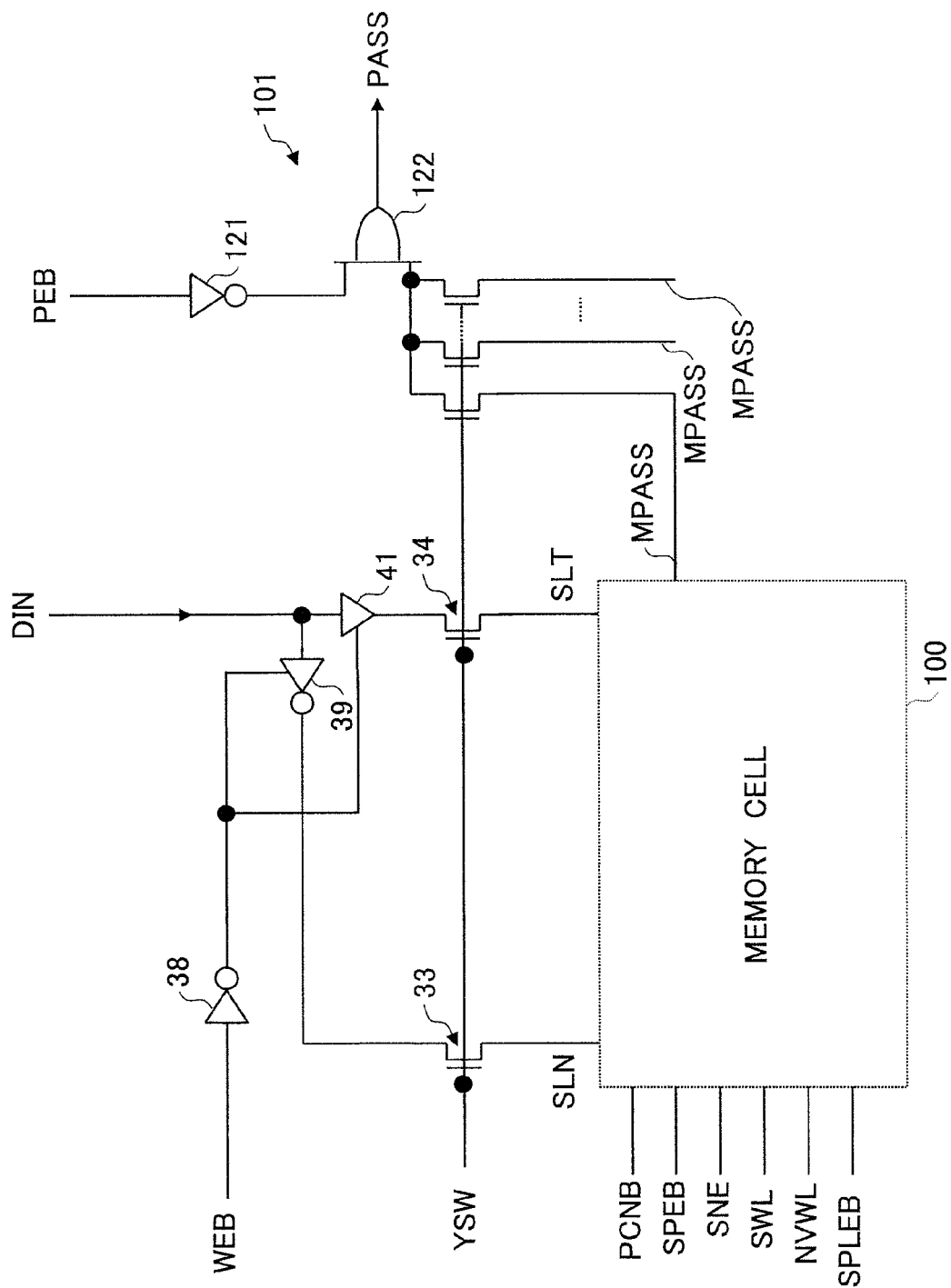
FIG. 13 is a drawing for explaining the consolidation of signal lines at a pass output unit.

FIG. 13 is a drawing for explaining the consolidation of the signal lines MPASS at the pass output unit 101. In FIG. 13, the same elements as those of FIG. 2 are referred to by the same numerals, and a description thereof will be omitted.

An inverter 121 and an AND gate 122 constitute the pass output unit 101. The inverter 121 receives the pass output enable signal PEB. The output of the inverter 121 is coupled to one of the two inputs of the AND gate 122. The other input of the AND gate 122 receives a wired-OR signal line that consolidates 8 signal lines MPASS corresponding to the 8 data bits of a selected column (i.e., selected Y address). If every and each one of the 8 signal lines MPASS is HIGH, the AND gate 122 produces a HIGH output as a signal PASS indicative of data match upon PEB being LOW. This signal PASS is output from the pass output unit 101 to outside the nonvolatile semiconductor memory device as shown in FIG. 11.

Schematics of the SRAM write operation, store operation, recall operation, and check operation of the second embodiment of the nonvolatile semiconductor memory device shown in FIG. 11 are substantially the same as those shown in FIG. 6. The signal DOE shown in FIG. 6, however, is nonexistent in the case of the second embodiment.

Figure 14:
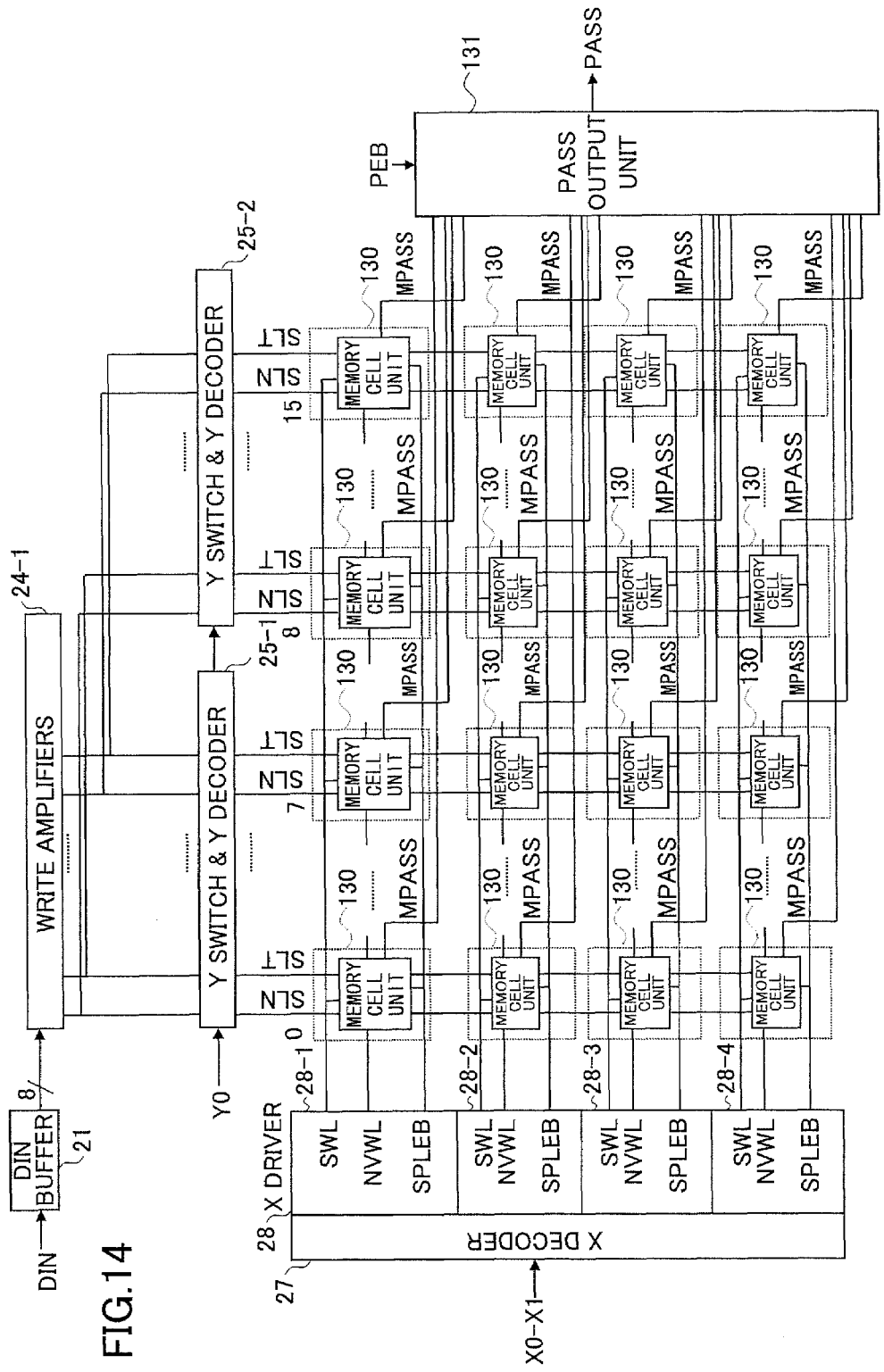
FIG. 14 is a drawing showing the configuration of a third embodiment of the nonvolatile semiconductor memory device according to the present invention.

FIG. 14 is a drawing showing the configuration of a third embodiment of the nonvolatile semiconductor memory device according to the present invention. In FIG. 14, the same elements as those of FIG. 1, FIG. 2, FIG. 5, and FIG. 11 are referred to by the same numerals, and a description thereof will be omitted. In FIG. 14, the illustration of the timing controller 26 is omitted for the sake of simplicity of illustration.

The configuration shown in FIG. 14 differs from the configuration shown in FIG. 11 in that a pass output unit 131 is provided for the purpose of consolidating the check results supplied from all the memory cell units. Namely, the data check is performed at once with respect to all the stored data bits. Since there is no need to select the signal lines MPASS in response to a specified Y address, the signal lines MPASS do not pass through the Y-decoder-&-Y-switch units 25-1 and 25-2 unlike in the case of the second embodiment shown in FIG. 11. Further, since a plurality of memory cells coupled to the same SARM data lines SLN and SLT at the same bit position need to perform data check independently of each other, each memory cell should be capable of storing a data bit to be checked in addition to a recalled data bit. Each memory cell unit 130 shown in FIG. 14 thus has two latch circuits as will be described in the following.

Figure 15:
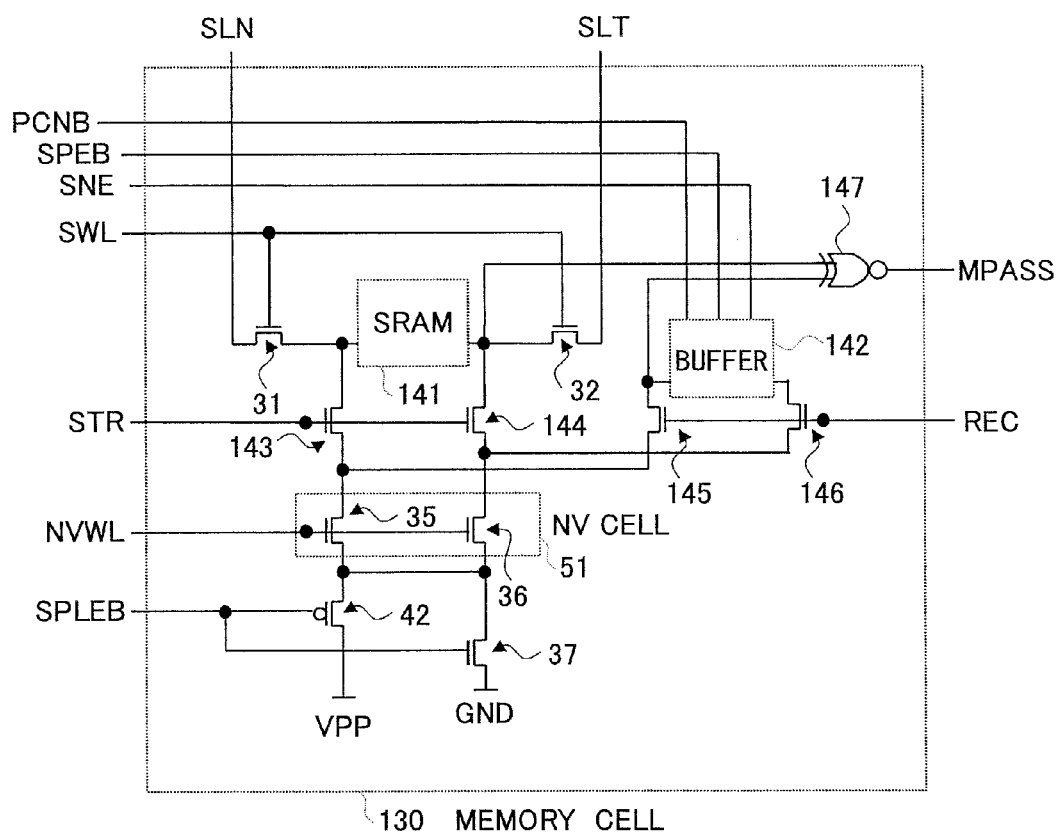
FIG. 15 is an illustrative drawing showing the configuration of a memory cell unit shown in FIG. 14.

FIG. 15 is an illustrative drawing showing the configuration of the memory cell unit 130. In FIG. 15, the same elements as those of FIG. 2 are referred to by the same numerals, and a description thereof will be omitted. The memory cell unit 130 includes, in addition to the NMOS transistors 31, 32, through 37, and the PMOS transistor 42 shown in FIG. 2, an SRAM cell 141, a buffer (latch) 142, NMOS transistors 143 through 146, and an NXOR gate 147.

Figure 16:
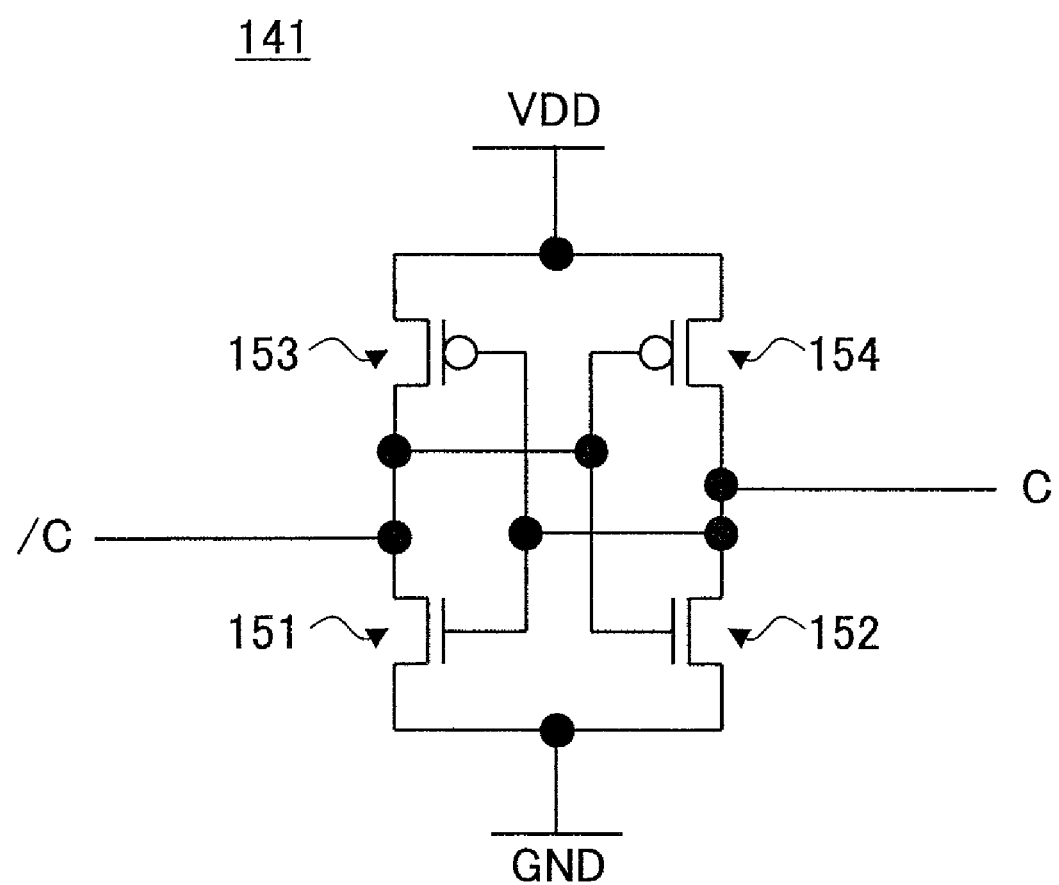
FIG. 16 is a drawing showing an example of the configuration of an SRAM cell shown in FIG. 15.

FIG. 16 is a drawing showing an example of the configuration of the SRAM cell 141 shown in FIG. 15. The SRAM cell 141 includes NMOS transistors 151 and 152 and PMOS transistors 153 and 154. An inverter comprised of the NMOS transistor 151 and the PMOS transistor 153 is cross-coupled to an inverter comprised of the NMOS transistor 152 and the PMOS transistor 154, thereby forming a latch circuit for storing one-bit data supplied through the SRAM data lines SLN and SLT.

Figure 17:
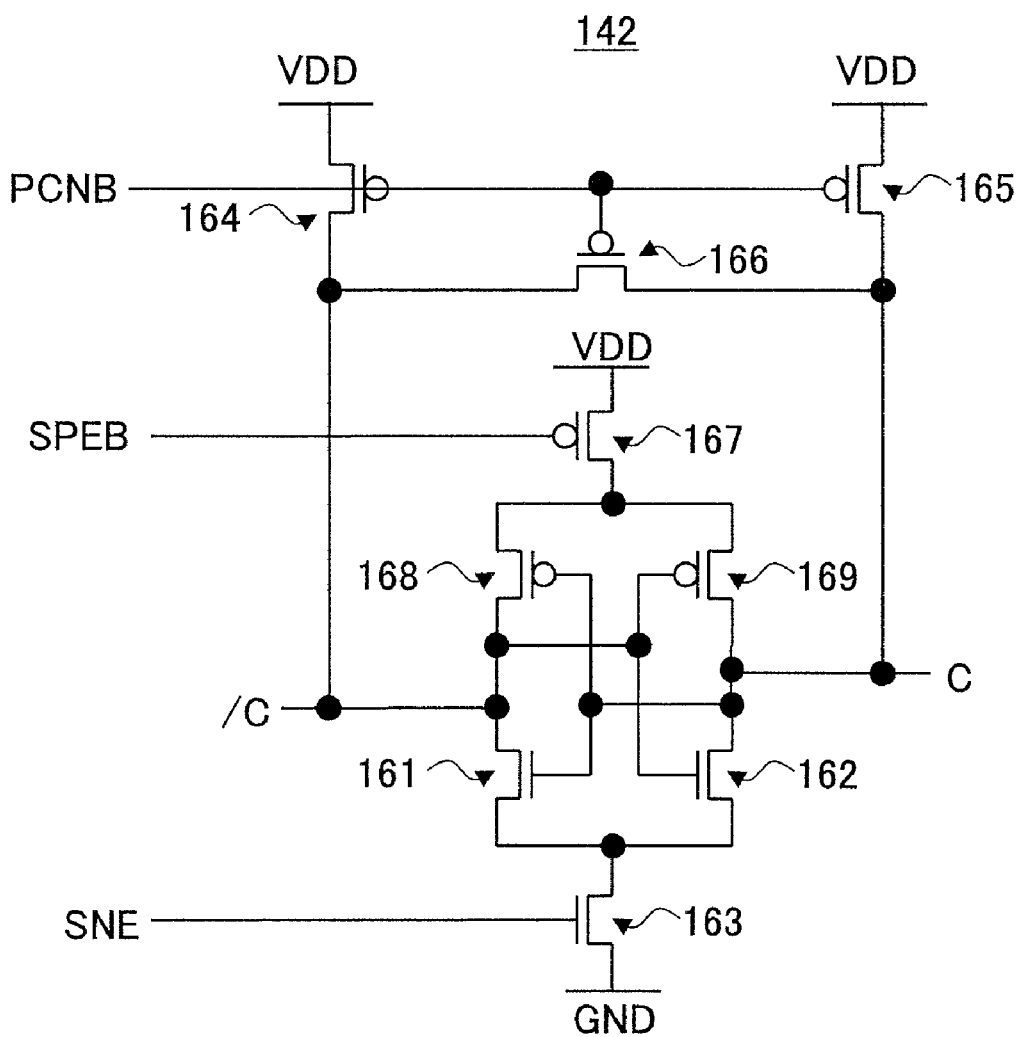
FIG. 17 is a drawing showing an example of the configuration of a buffer shown in FIG. 15.

FIG. 17 is a drawing showing an example of the configuration of the buffer 142 shown in FIG. 15. The buffer (latch) 142 shown in FIG. 17 includes NMOS transistors 161 through 163 and PMOS transistors 164 through 169. An inverter comprised of the NMOS transistor 161 and the PMOS transistor 168 is cross-coupled to an inverter comprised of the NMOS transistor 162 and the PMOS transistor 169, thereby forming a latch circuit for amplifying a voltage difference appearing between nodes C and /C in response to data stored in the NV cell 51.

Turning back to FIG. 15, the SRAM cell 141 serves as a latch circuit for storing one-bit data that is to be stored in the NV cell 51. During the store operation, the store select signal STR is set to HIGH to make the NMOS transistors 143 and 144 conductive, thereby electrically coupling the SRAM cell 141 to the NV cell 51. The buffer 142 serves as a sense circuit to sense (recall) data stored in the NV cell 51. During the recall operation, the recall select signal REC is set to HIGH to make the NMOS transistors 145 and 146 conductive, thereby electrically coupling the NV cell 51 to the buffer 142. After the recall operation, the SRAM cell 141 also serves as a latch circuit for storing one-bit data that is to be checked against the recalled one-bit data stored in the buffer 142.

The NXOR gate 147 compares an SLN-side bit of the recalled data stored in the buffer 142 with an SLT-side bit of the supplied data stored in the SRAM cell 141. The output of the NXOR gate 147 is HIGH if the recalled data and the supplied data are the same, and is LOW if the recalled data and the supplied data are different. The output of the NXOR gate 147 is supplied to the pass output unit 131 (see FIG. 14) through the corresponding signal line MPASS.

Figure 18:
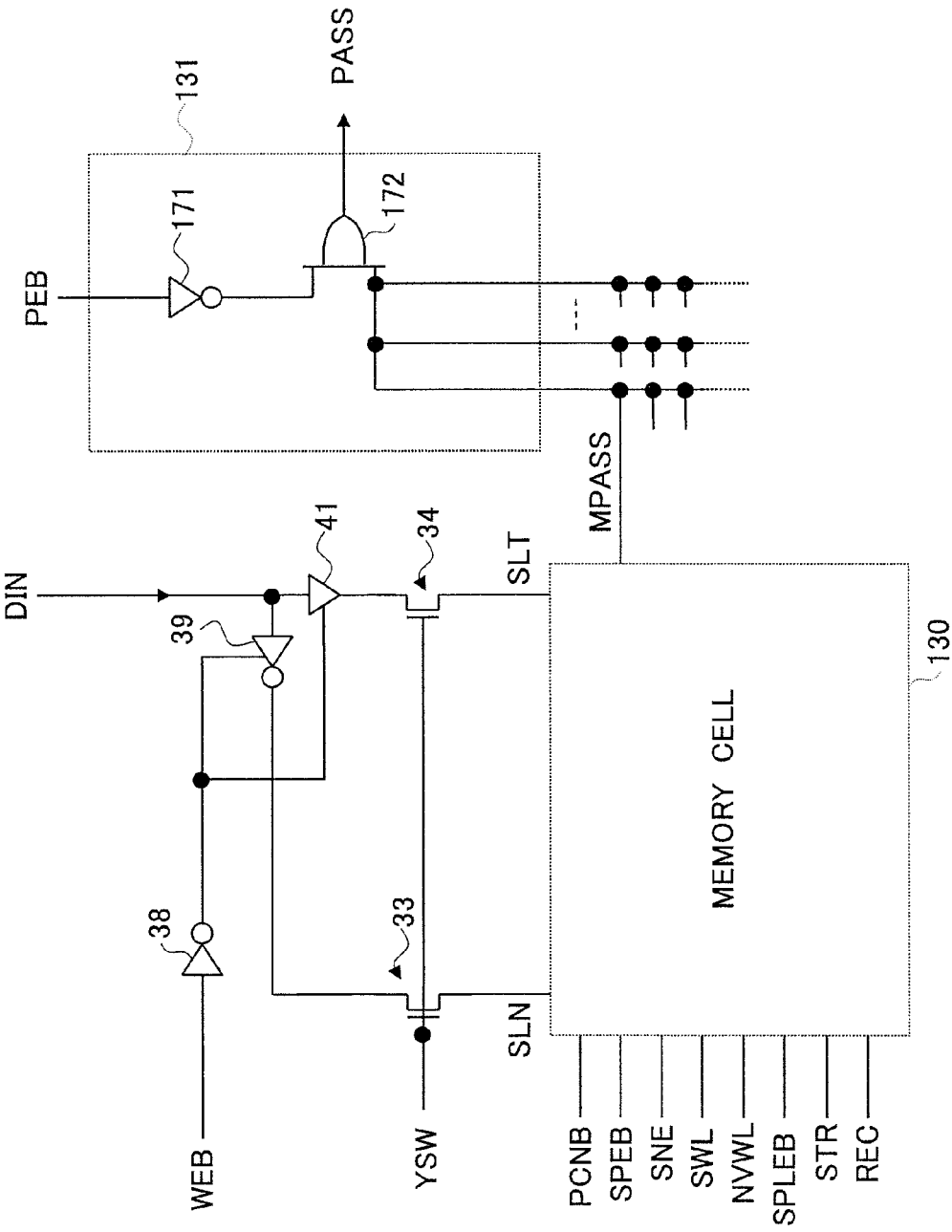
FIG. 18 is a drawing for explaining the consolidation of signal lines at a pass output unit shown in FIG. 14.

FIG. 18 is a drawing for explaining the consolidation of the signal lines MPASS at the pass output unit 131 shown in FIG. 14. In FIG. 18, the same elements as those of FIG. 2 and FIG. 13 are referred to by the same numerals, and a description thereof will be omitted.

An inverter 171 and an AND gate 172 constitute the pass output unit 131. The inverter 171 receives the pass output enable signal PEB. The output of the inverter 171 is coupled to one of the two inputs of the AND gate 172. The other input of the AND gate 172 receives a wired-OR signal line that consolidates all the signal lines MPASS supplied from all the memory cell units 130. If every and each one of the signal lines MPASS is HIGH, the AND gate 172 produces a HIGH output as a signal PASS indicative of data match upon PEB being LOW. This signal PASS is output from the pass output unit 131 to outside the nonvolatile semiconductor memory device as shown in FIG. 14.

Figure 19:
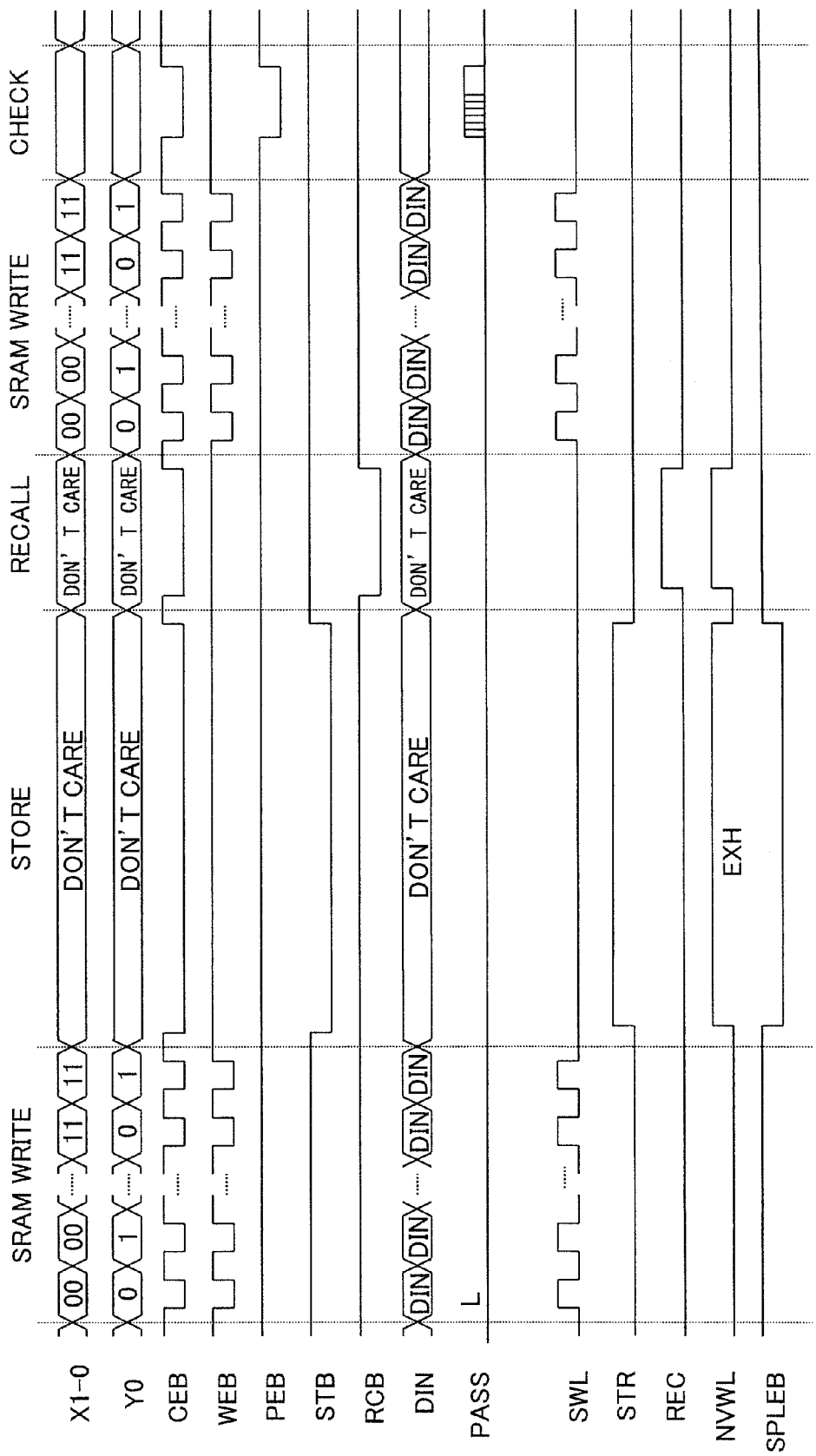
FIG. 19 is a timing chart for explaining operations of the nonvolatile semiconductor memory device shown in FIG. 14.

FIG. 19 is a timing chart for explaining operations of the nonvolatile semiconductor memory device shown in FIG. 14. The basic mechanism of nonvolatile data storing and recalling is the same as that of the first embodiment described in connection with FIG. 6. In the following, only the outlines of the operations of the nonvolatile semiconductor memory device will be described with particular note to characteristic features of the third embodiment.

The first operation shown in FIG. 19 is an SRAM write operation that writes data to all the SRAM cells 141. While the store enable signal STB, the pass output enable signal PEB, and the recall enable signal RCB are kept at HIGH, the write enable signal WEB and the chip enable signal CEB are repeatedly set to LOW to specify successive write timings. At these write timings, respective addresses and data are supplied to the nonvolatile semiconductor memory device. After 8 SRAM write operations, the SRAM cells 141 of all the 64 memory cell units 130 shown in FIG. 14 have data stored therein.

The second operation shown in FIG. 19 is a store operation that causes the NV cells 51 to store the data of the SRAM cells 141 in all the 64 memory cell units 130 at once. The store enable signal STB and the chip enable signal CEB are set to LOW while the pass output enable signal PEB, the recall enable signal RCB, and the write enable signal WEB are set to HIGH. With these signal level settings, some of the NMOS transistors of the NV cells 51 are subjected to a hot-carrier effect, resulting in the transistor characteristics thereof being changed. It should be noted that the store select signal STR and the recall select signal REC are set to HIGH and LOW, respectively, in the store operation. The NV cells 51 are thus electrically coupled to the SRAM cells 141, but are not electrically coupled to the buffers 142.

The third operation shown in FIG. 19 is a recall operation that recalls the data stored in the NV cells 51 at once for storage in the buffers 142 with respect to all the 64 memory cell units 130. The store enable signal STB, the pass output enable signal PEB, and the write enable signal WEB are kept at HIGH, and the recall enable signal RCB and the chip enable signal CEB are set to LOW to indicate a recall operation. It should be noted that the store select signal STR and the recall select signal REC are set to LOW and HIGH, respectively, in the recall operation. The NV cells 51 are thus electrically coupled to the buffers 142, but are not electrically coupled to the SRAM cells 141.

The fourth operation shown in FIG. 19 is an SRAM write operation that writes data to all the SRAM cells 141. While the store enable signal STB, the pass output enable signal PEB, and the recall enable signal RCB are kept at HIGH, the write enable signal WEB and the chip enable signal CEB are repeatedly set to LOW to specify successive write timings. At these write timings, respective addresses and data are supplied to the nonvolatile semiconductor memory device. After 8 SRAM write operations, the SRAM cells 141 of all the 64 memory cell units 130 shown in FIG. 14 have data stored therein. These data bits will be compared with the recalled data bits in the following check operation.

The fifth operation shown in FIG. 19 is a check operation (authentication operation) that checks the sameness of the latest supplied data stored in the SRAM cells 141 and the recalled data stored in the buffers 142. The store enable signal STB, the recall enable signal RCB, and the write enable signal WEB are kept at HIGH, and the chip enable signal CEB and the pass output enable signal PEB are set to LOW to indicate a check operation. In this check operation, all the latest supplied data bits are compared with the respective recalled data bits in the 64 memory cell units 130 shown in FIG. 14, and the check results are supplied from the 64 memory cell units 130 to the pass output unit 131. If data matches with respect to each of the 64 bits, the signal PASS output from the pass output unit 131 is asserted.

In the manner as described above, the third embodiment is configured such that data check is performed at once with respect to all the data bits stored in the nonvolatile semiconductor memory device. This makes it possible to perform reliable authentication that utilizes a bit width far wider than the bit width of data that is written/read for a single write/read operation.

Further, the present invention is not limited to these embodiments, but various variations and modifications may be made without departing from the scope of the present invention.

What is claimed is:

1. A nonvolatile semiconductor memory device, comprising:
    a data input buffer configured to receive data from outside the nonvolatile semiconductor memory device;
    a nonvolatile memory cell including two MIS transistors to store first data received by the data input buffer by creating an irreversible change of transistor characteristics in one of the two MIS transistors, whichever is selected in response to a value of the first data;
    a sense latch coupled to the nonvolatile memory cell and configured to store the first data obtained by sensing a difference in the transistor characteristics between the two MIS transistors of the nonvolatile memory cell; and
    a logic circuit configured to produce a signal indicative of comparison between the first data stored in the sense latch and second data received by the data input buffer, the signal being output to outside the nonvolatile semiconductor memory device,
    wherein no data path to output the first data stored in the sense latch to outside the nonvolatile semiconductor memory device exists.

2. The nonvolatile semiconductor memory device as claimed in claim 1, comprising a plurality of memory cell units arranged in rows and columns, each of the memory cell units having an identical circuit configuration including the nonvolatile memory cell and the sense latch, wherein the logic circuit is configured to produce the signal as a signal indicative of whether the first data stored in the sense latch and the second data received by the data input buffer are identical to each other with respect to all of selected ones of the memory cells units.

3. The nonvolatile semiconductor memory device as claimed in claim 2, wherein the selected ones of the memory cell units correspond to a single row address and a single column address.

4. The nonvolatile semiconductor memory device as claimed in claim 1, comprising a plurality of memory cell units arranged in rows and columns, wherein each of the memory cell units has an identical circuit configuration that includes:
    the nonvolatile memory cell:
    the sense latch; and
    a comparison circuit configured to compare the first data stored in the sense latch and the second data received by the data input buffer.

5. The nonvolatile semiconductor memory device as claimed in claim 4, wherein the logic circuit is configured to produce the signal as a signal indicative of whether the first data stored in the sense latch and the second data received by the data input buffer are identical to each other with respect to all of selected ones of the memory cells units.

6. The nonvolatile semiconductor memory device as claimed in claim 5, wherein the selected ones of the memory cell units correspond to a single row address and a single column address.

7. The nonvolatile semiconductor memory device as claimed in claim 4, wherein each of the memory cell units further includes a data latch configured to store the second data.

8. The nonvolatile semiconductor memory device as claimed in claim 7, wherein the logic circuit is configured to produce the signal as a signal indicative of whether the first data stored in the sense latch and the second data stored in the data latch are identical to each other in all the memory cell units.

* * * * *